(12) United States Patent
Hong et al.

(10) Patent No.: US 8,178,787 B2
(45) Date of Patent: May 15, 2012

(54) CIRCUIT BOARD INCLUDING ALIGNED NANOSTRUCTURES

(75) Inventors: Seung Hun Hong, Seoul (KR); Min Baek Lee, Yongin-si (KR)

(73) Assignee: SNU R&DB Foundation, Seoul (KR)

( * ) Notice: Subject to any disclaimer, the term of this patent is extended or adjusted under 35 U.S.C. 154(b) by 777 days.

(21) Appl. No.: 12/198,744

(22) Filed: Aug. 26, 2008

(65) Prior Publication Data
US 2010/0051320 A1    Mar. 4, 2010

(51) Int. Cl.
*H05K 1/00* (2006.01)
(52) U.S. Cl. ........ 174/254; 174/250; 361/749; 977/883; 977/902; 977/734; 977/932
(58) Field of Classification Search .......... 174/250–268; 361/748–803; 29/846
See application file for complete search history.

(56) References Cited

U.S. PATENT DOCUMENTS

| | | | |
|---|---|---|---|
| 6,027,958 A | 2/2000 | Vu et al. | |
| 6,918,284 B2 | 7/2005 | Snow et al. | |
| 7,052,588 B2 | 5/2006 | Gu et al. | |
| 7,232,771 B2 | 6/2007 | Jacobs et al. | |
| 7,696,022 B2 * | 4/2010 | Ikeda | 438/149 |
| 7,906,380 B2 * | 3/2011 | Ikeda | 438/149 |
| 2004/0166233 A1 | 8/2004 | Hong | |
| 2005/0079659 A1 | 4/2005 | Duan et al. | |
| 2008/0081535 A1 | 4/2008 | Perlo et al. | |
| 2009/0173527 A1* | 7/2009 | Benke et al. | 174/261 |
| 2009/0265929 A1 | 10/2009 | Nakagawa et al. | |

FOREIGN PATENT DOCUMENTS

| | | |
|---|---|---|
| CN | 1684566 | 10/2005 |
| JP | 2007-158117 | 6/2007 |
| JP | 2007-329351 | 12/2007 |
| KR | 10-2007-0112733 | 11/2007 |
| KR | 10-2008-0040241 | 5/2008 |
| KR | 10-2008-0069995 | 7/2008 |
| WO | WO 2007/037381 A1 | 4/2007 |
| WO | WO 2007/114649 A1 | 10/2007 |

OTHER PUBLICATIONS

A. Behnam et al., "Resistivity scaling in single-walled carbon nanotube films patterned to submicron dimensions", Applied Physics Letters 89, 093107, 2006.
K. Bradley, et al., "Flexible Nanotube Electronics", Nano Letters, 2003, vol. 3, No. 10, p. 1353-1355.
Y.J. Jung, et al., "Aligned Carbon Nanotube-Polymer Hybrid Architectures for Diverse Flexible Electronic Applications", Nano Letters, 2006, vol. 6, No. 3, p. 413-418.
J. Kang, et al., "Large-scale assembly of carbon nanotube-based flexible circuits for DNA sensors", Nanotechnology 19, 135305, 2008, p. 1-4.
M. Miller et al., "Large-scale assembly of carbon nanotubes", Nature, vol. 425, Sep. 4, 2003, p. 36-37.

(Continued)

*Primary Examiner* — Zachary M Pape
(74) *Attorney, Agent, or Firm* — Knobbe, Martens, Olson & Bear, LLP

(57) ABSTRACT

A circuit board includes a substrate, a polar molecular layer pattern and a nonpolar molecular layer pattern, which are disposed on the substrate, a first electrode and a second electrode, which are disposed on the substrate, and one or more channels disposed on the polar molecular layer pattern and including linear nanostructures. The one or more channels facilitate to electrically couple the first electrode to the second electrode.

28 Claims, 20 Drawing Sheets

OTHER PUBLICATIONS

Office Action mailed Aug. 12, 2010 in Japanese Patent Application No. 2008-310521.

Decision to Grant a Patent dated Mar. 24, 2011, in JP Pat. Appln. No. 2008-310521.

English translation of allowed claims for JP Pat. Appln. No. 2008-310521.

Notice of Allowance and English translation of allowed claims in Chinese Application No. 200810180799.1, mailed Jun. 15, 2011.

Jackman, R.J., et al., "Using Elastomeric Membranes as Dry Resists and for Dry Lift-Off," *Langmuir* 1999, pp. 2973-2984, vol. 15, No. 8.

Lee, M. et al., "Linker-Free Directed Assembly of High-Performance Integrated Devices Based on Nanotubes and Nanowires," *Nature Nanotechnology* 1, 2006, pp. 66-71.

Myung, S. et al., "Large-Scale "Surface-Programmed Assembly" of Pristine Vanadium Oxide Nanowire-Based Devices, " *Advanced Materials*, Oct. 2005, pp. 2361-2364, vol. 17, No. 19.

* cited by examiner

[Fig. 1]
100
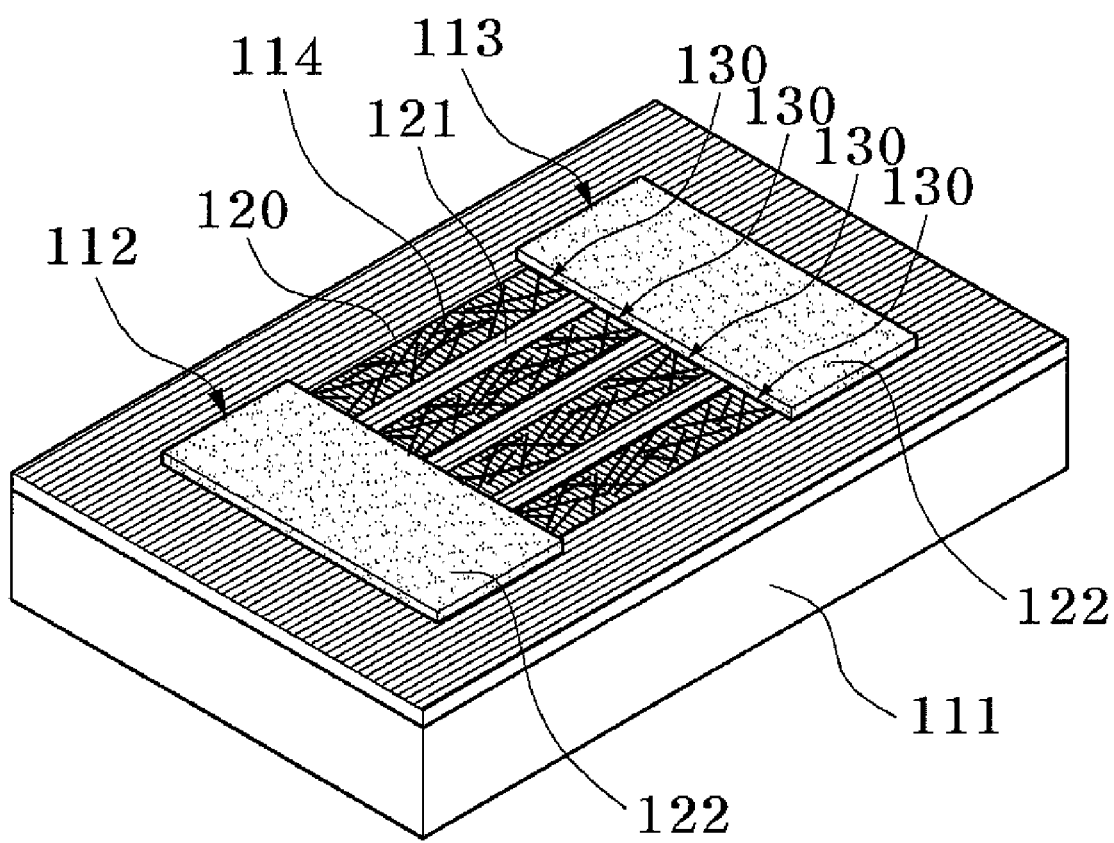

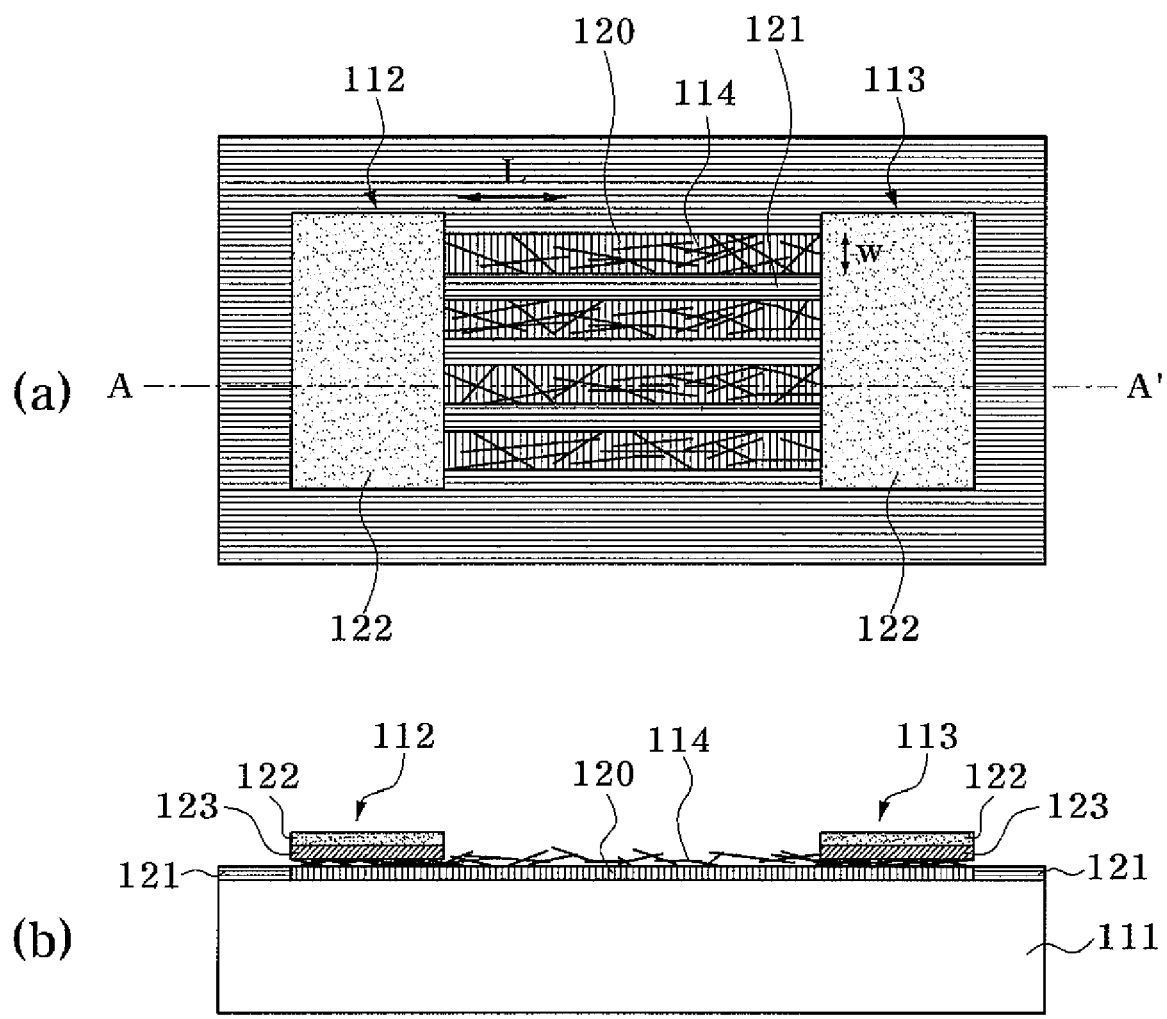
[Fig. 2]

[Fig. 3]
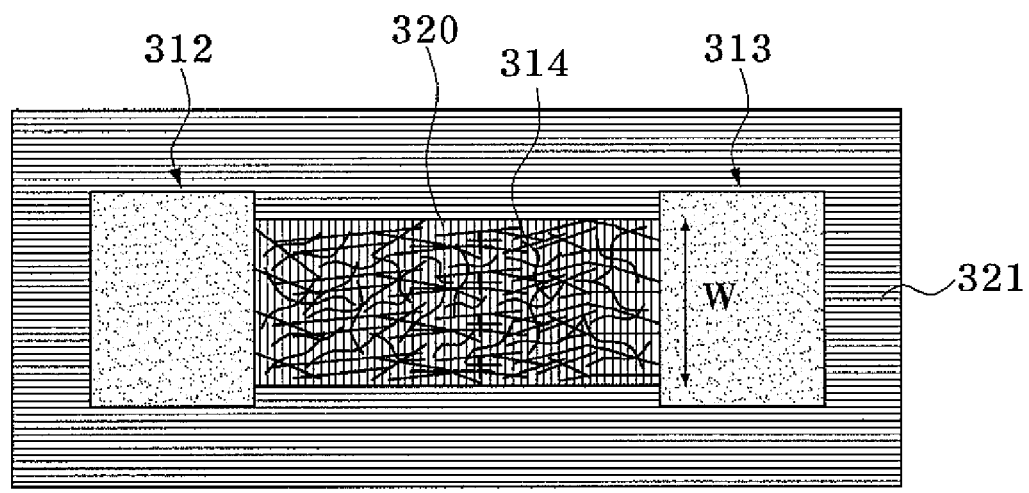
(a)
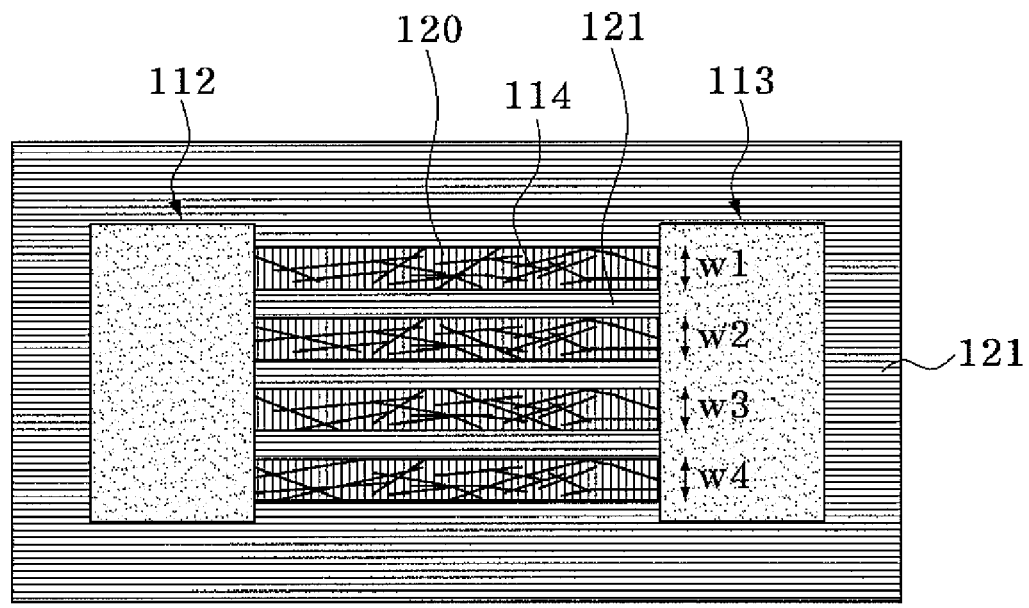
(b)

[Fig. 4]
400
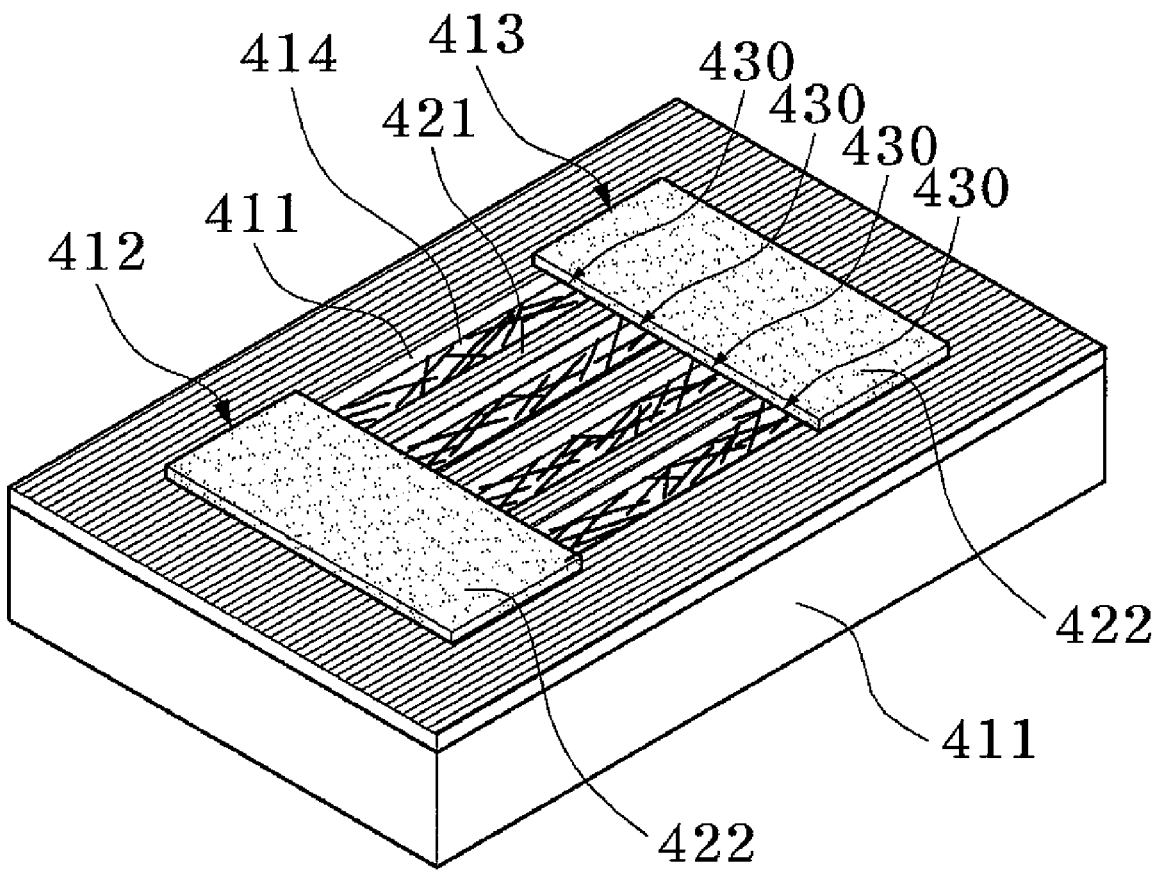

[Fig. 5]
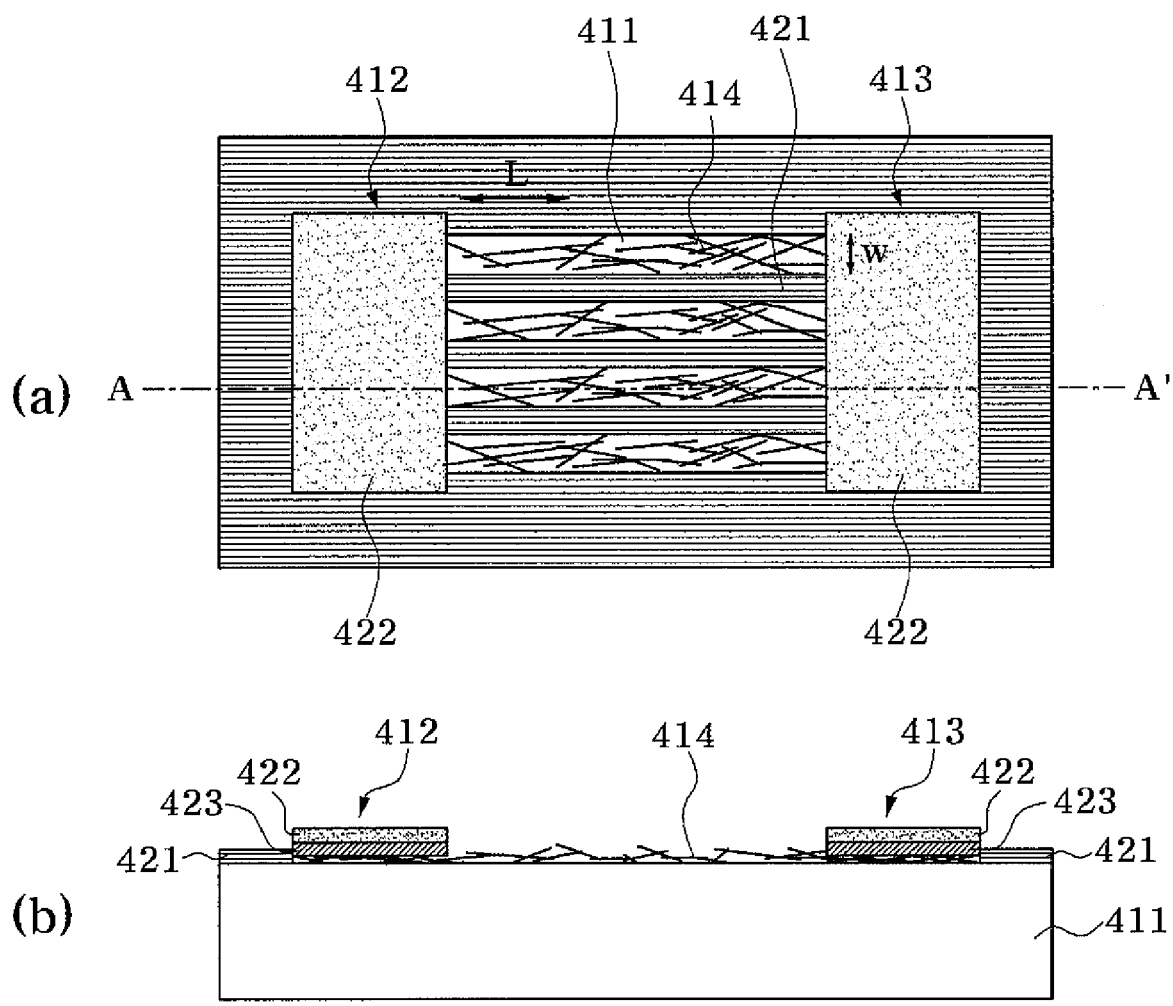

[Fig. 6]
600
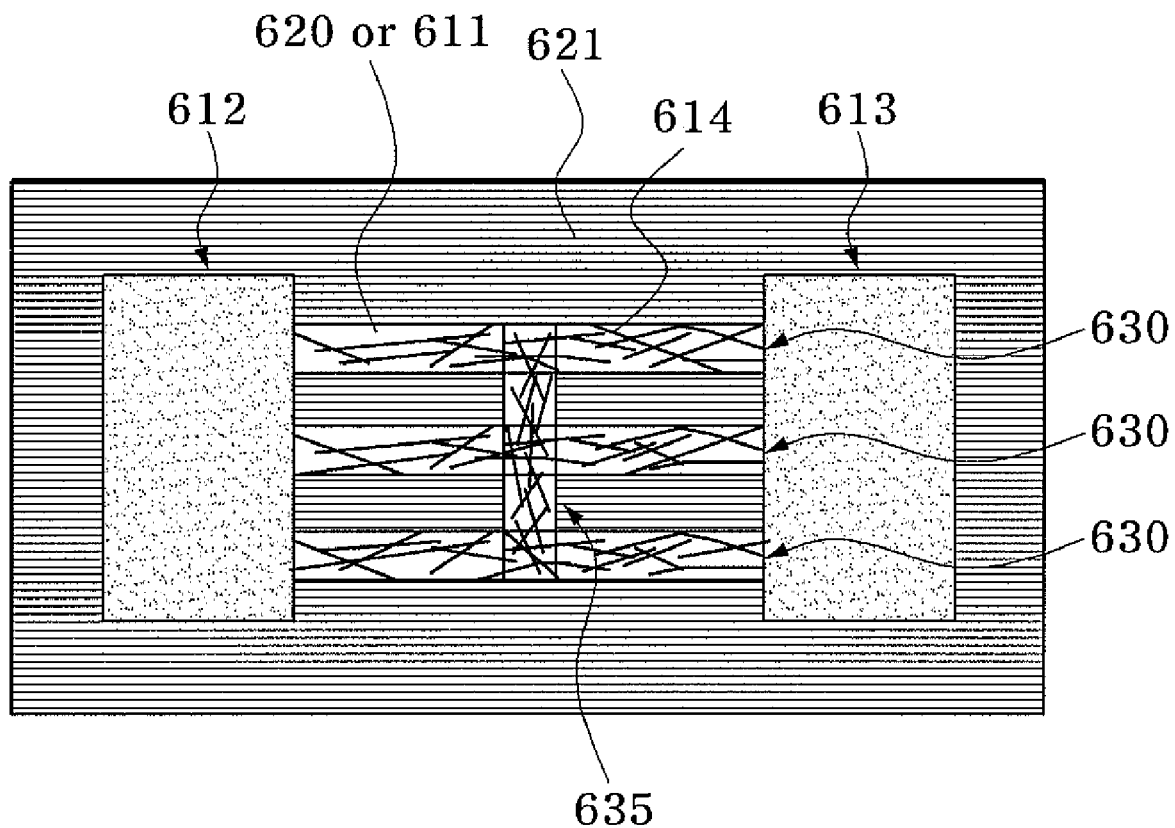

[Fig. 7]
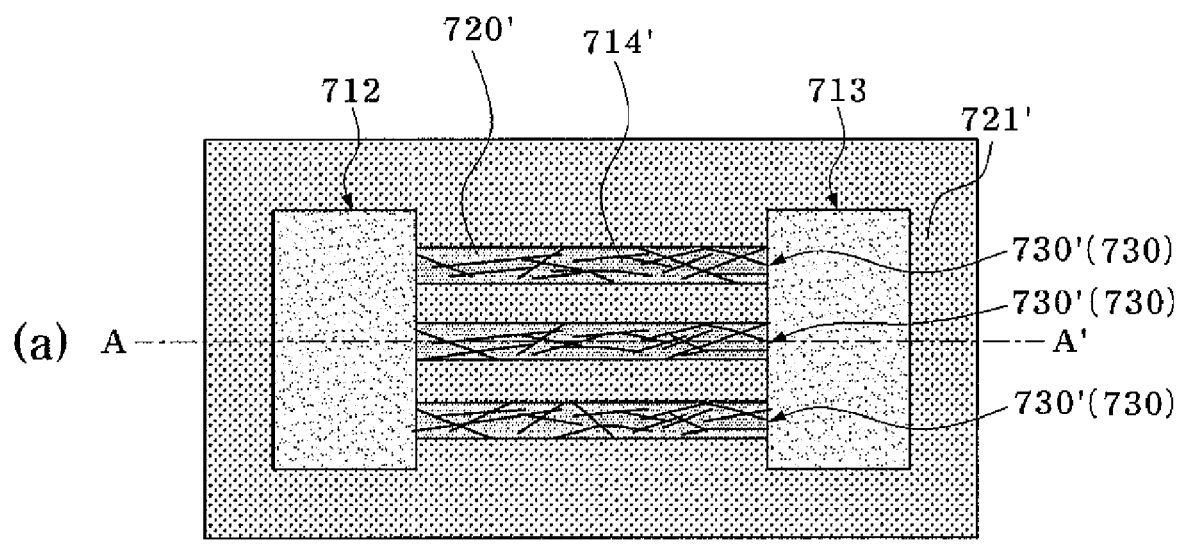
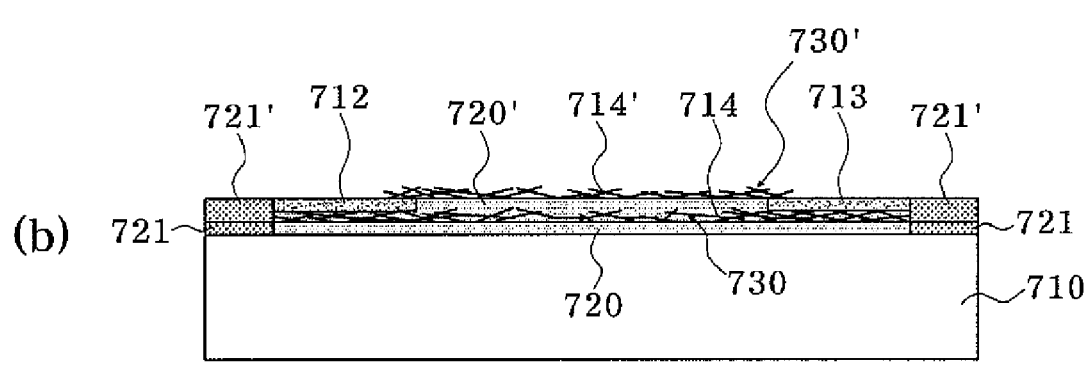

[Fig. 8]
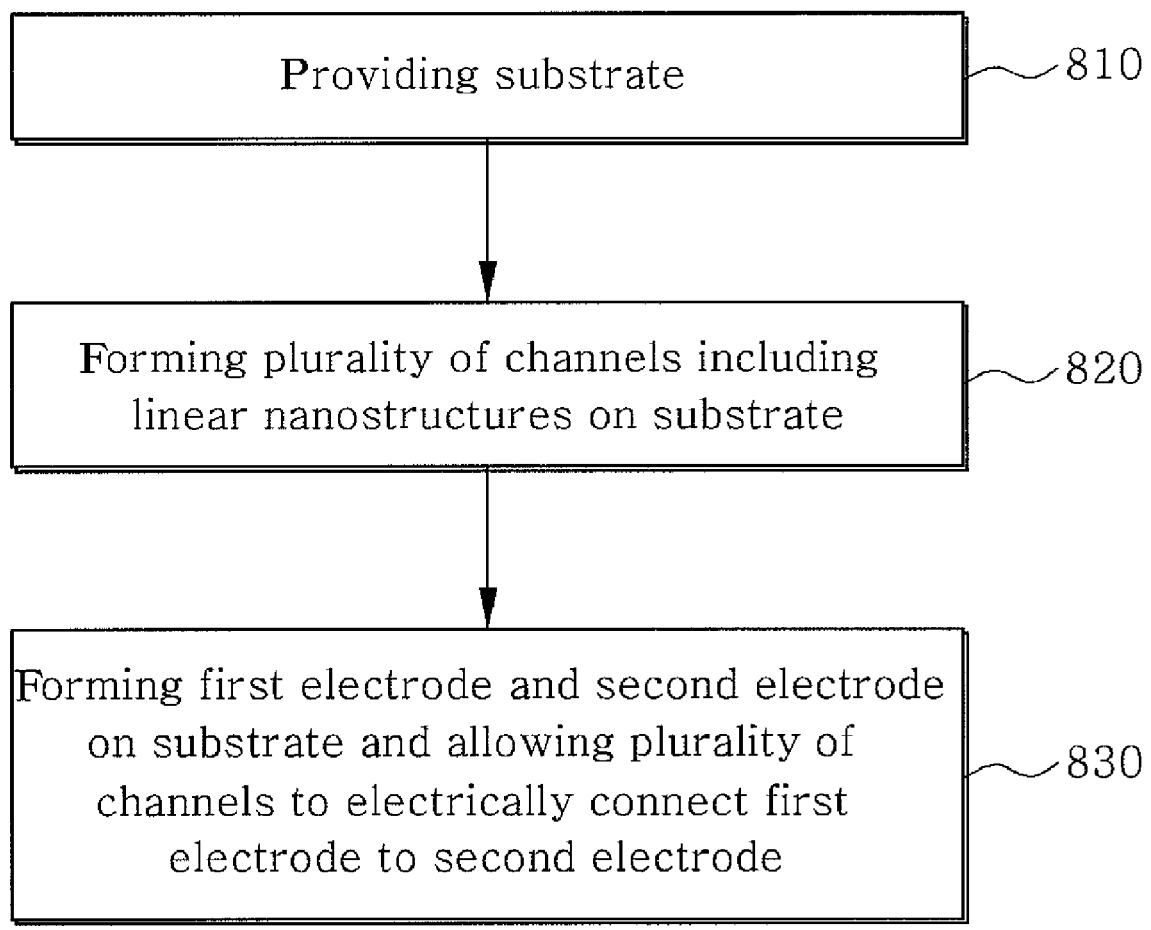

[Fig. 9]
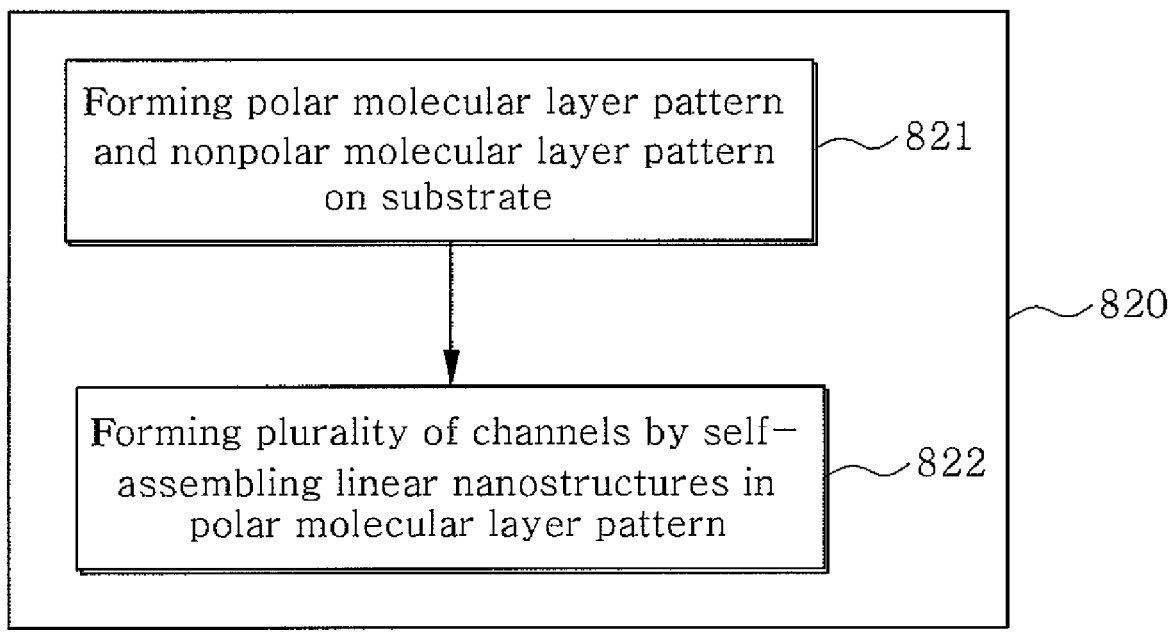

[Fig. 10]
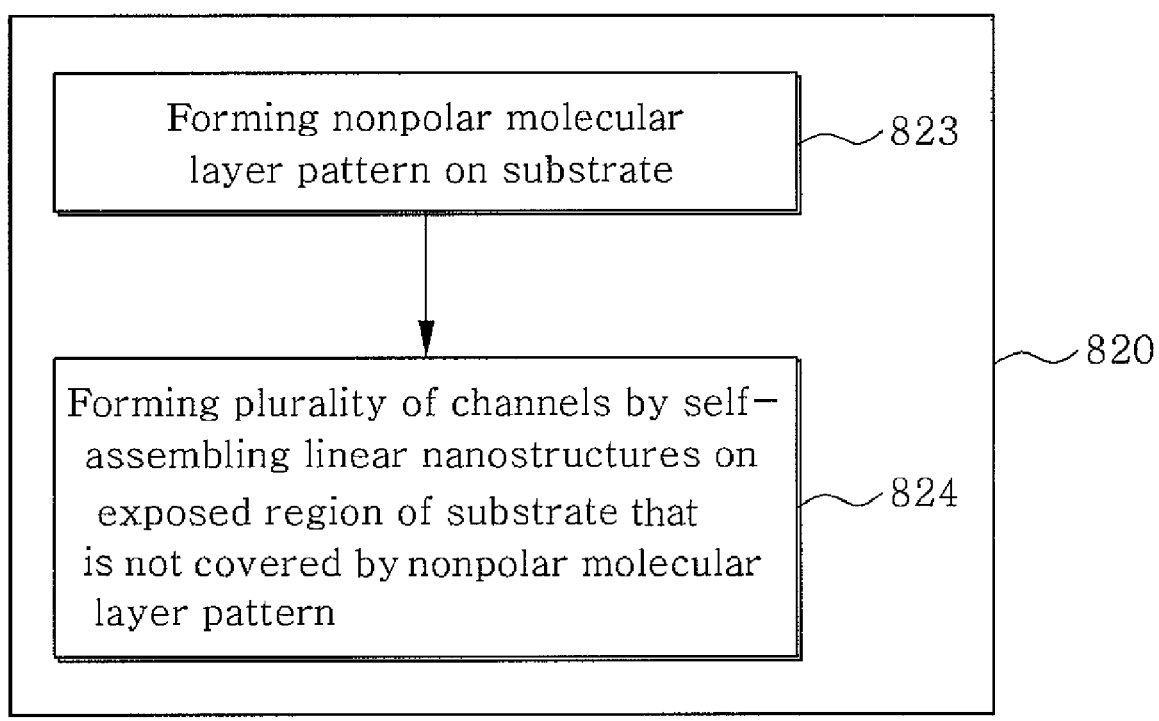

[Fig. 11]
(a) 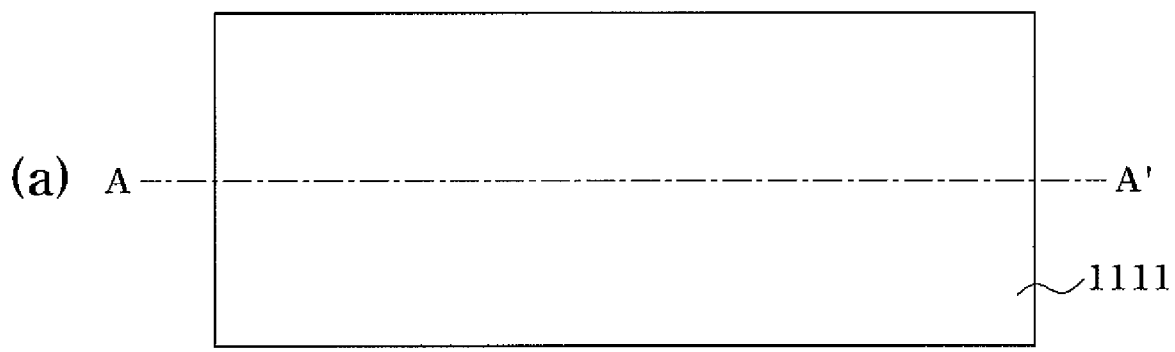
(b) 

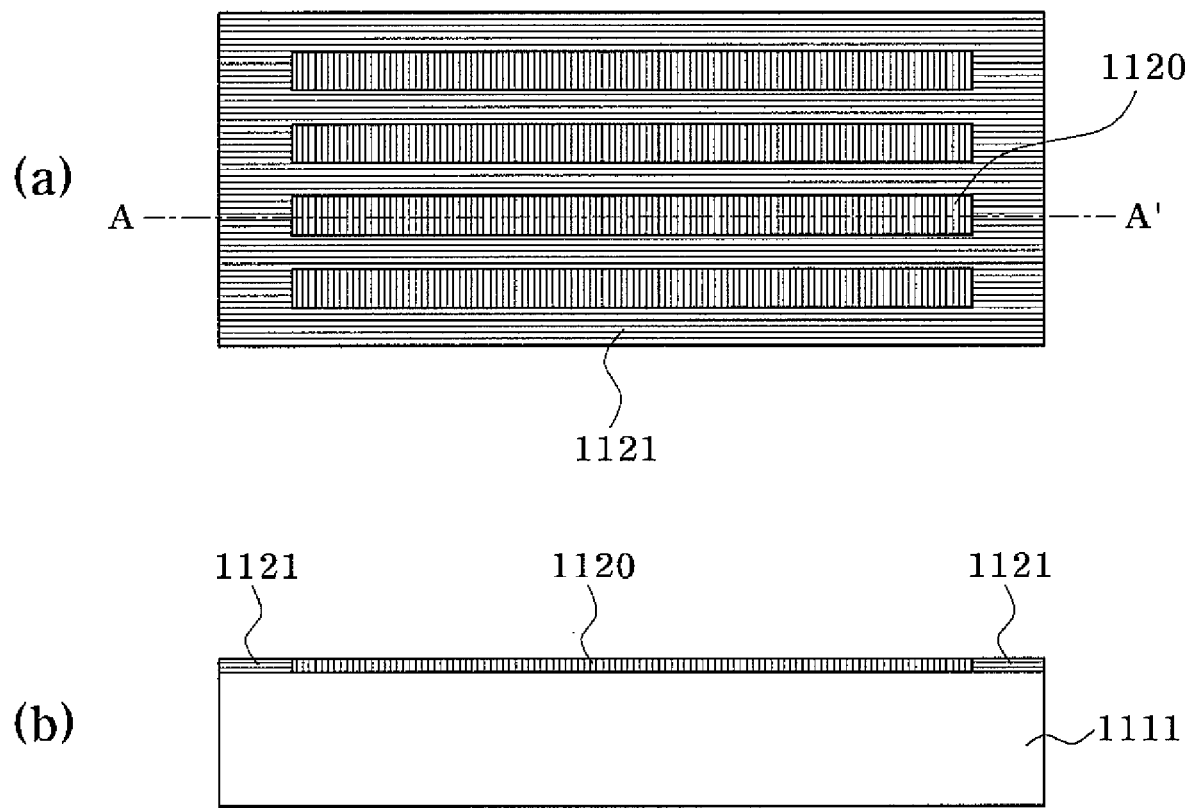
[Fig. 12]

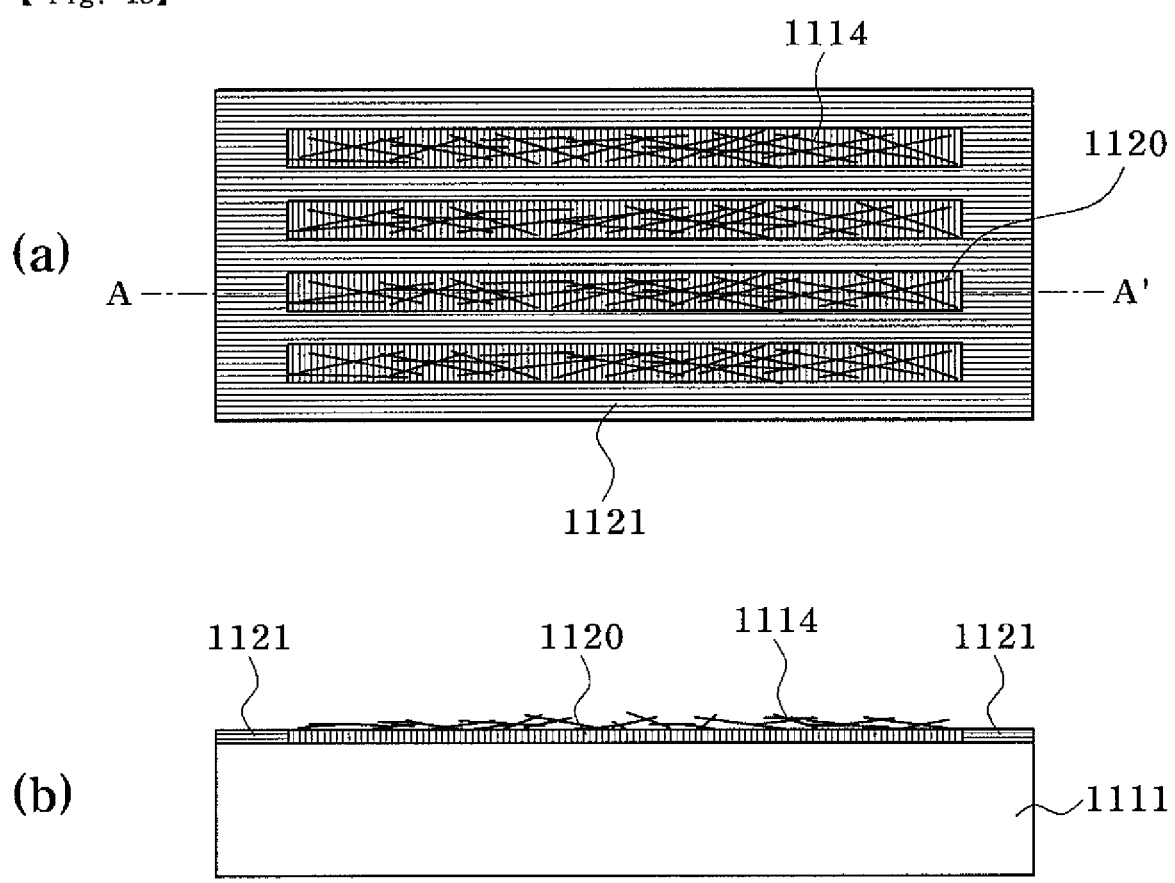
[Fig. 13]

[Fig. 14]
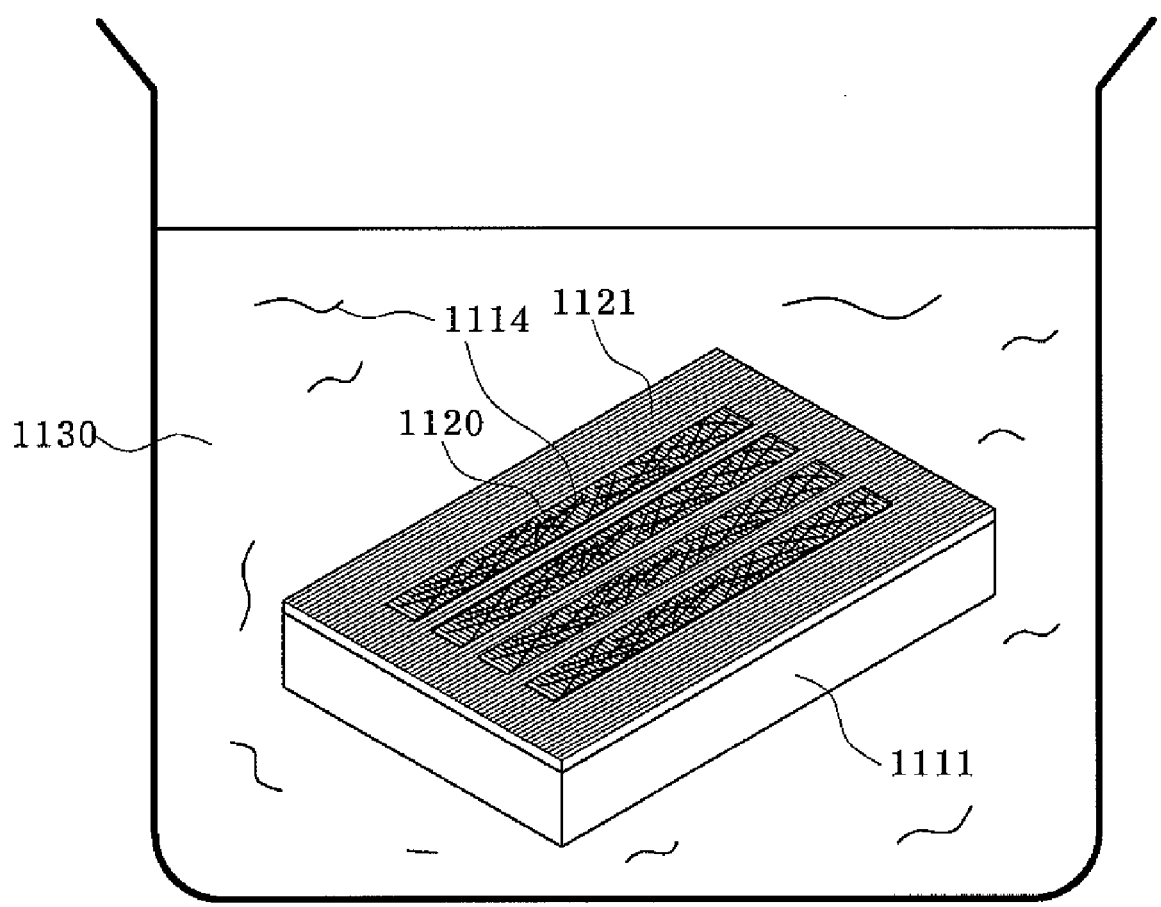

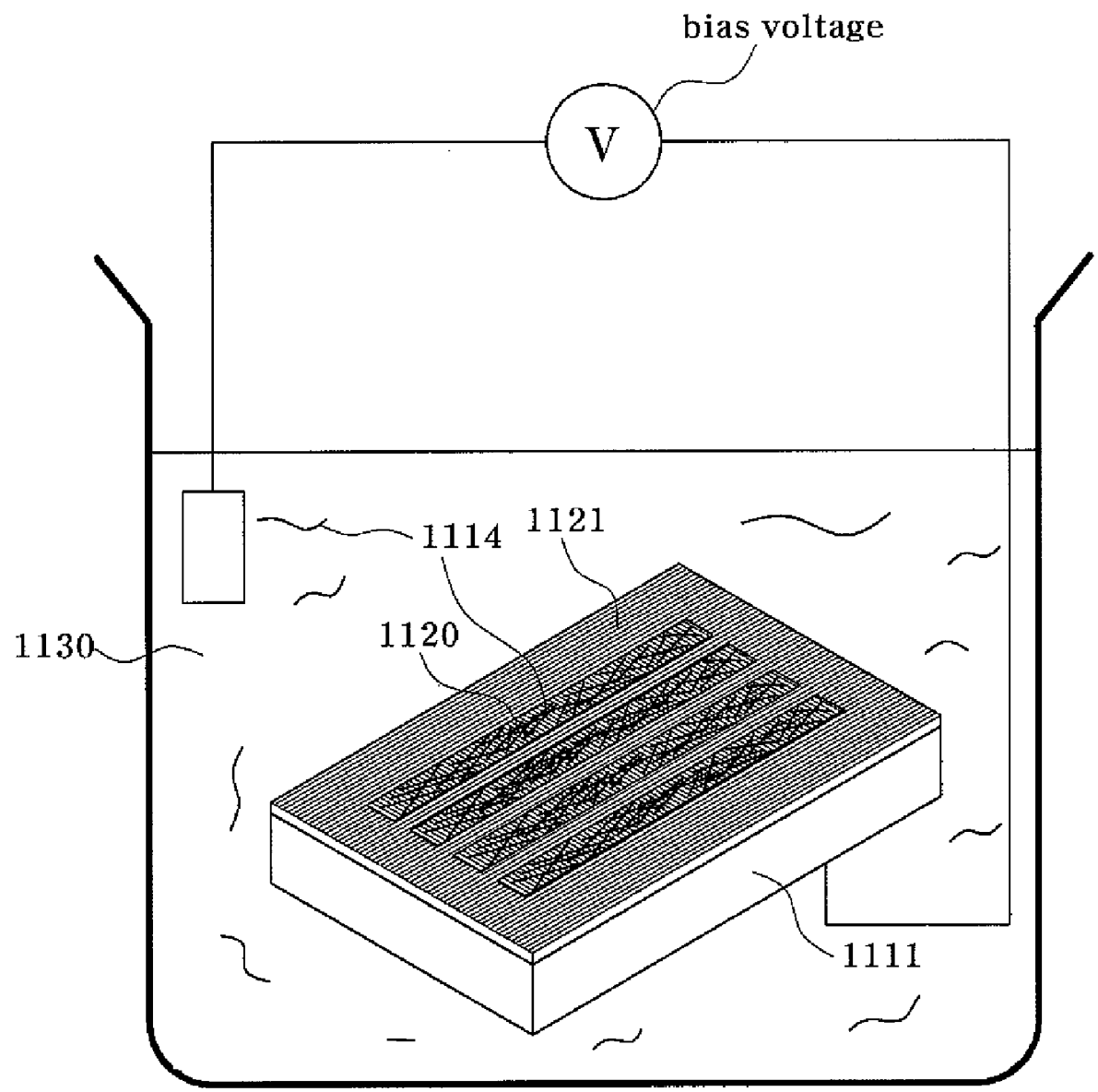
[Fig. 15]

[Fig. 16]
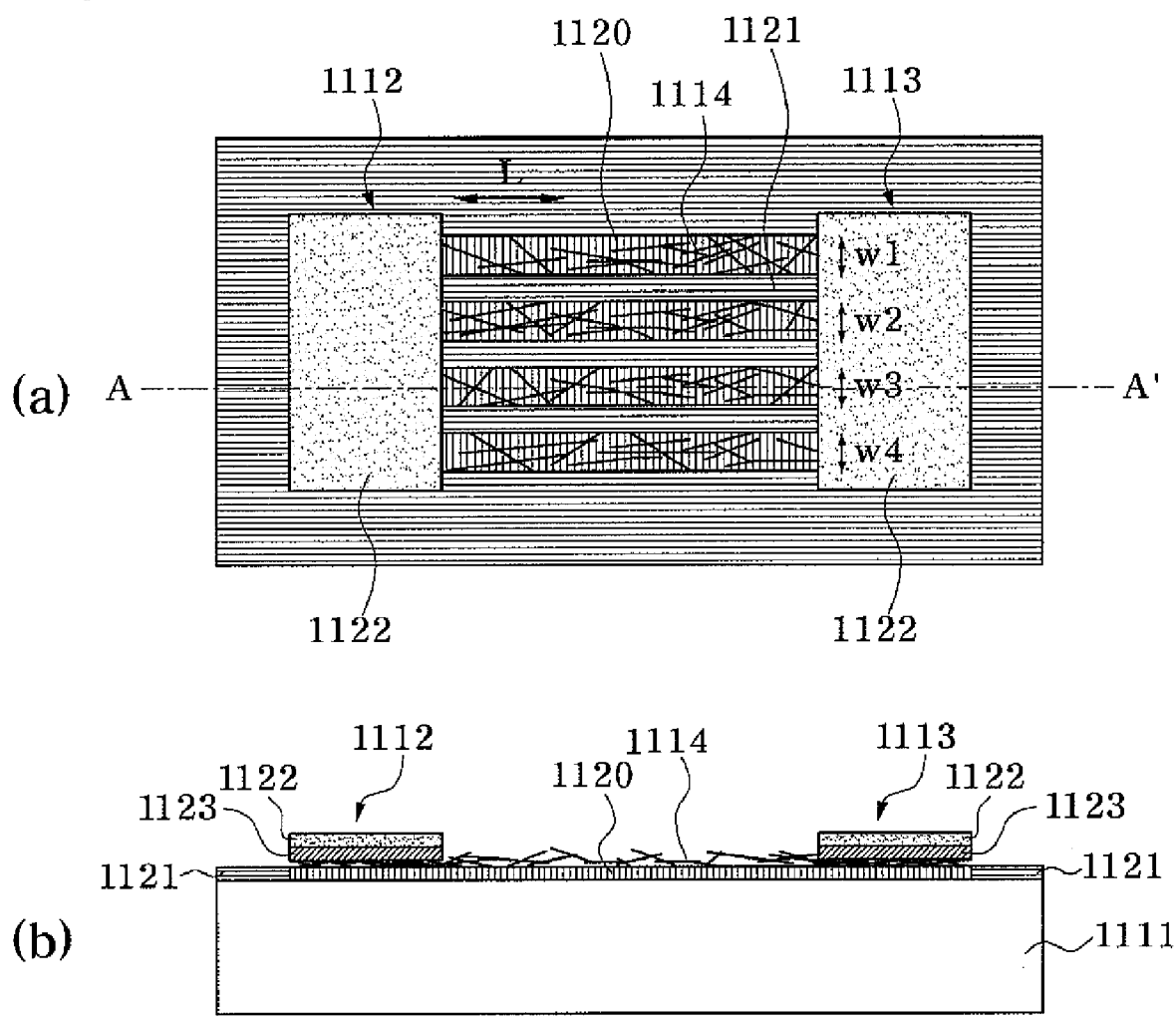

[Fig. 17]
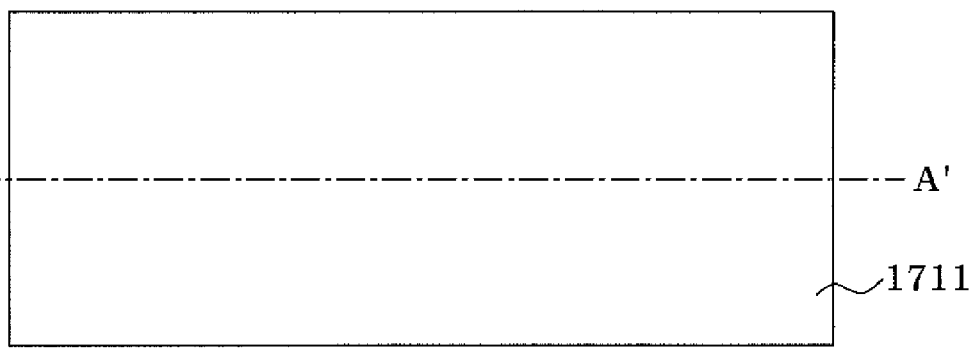
(a)
(b)

[Fig. 18]
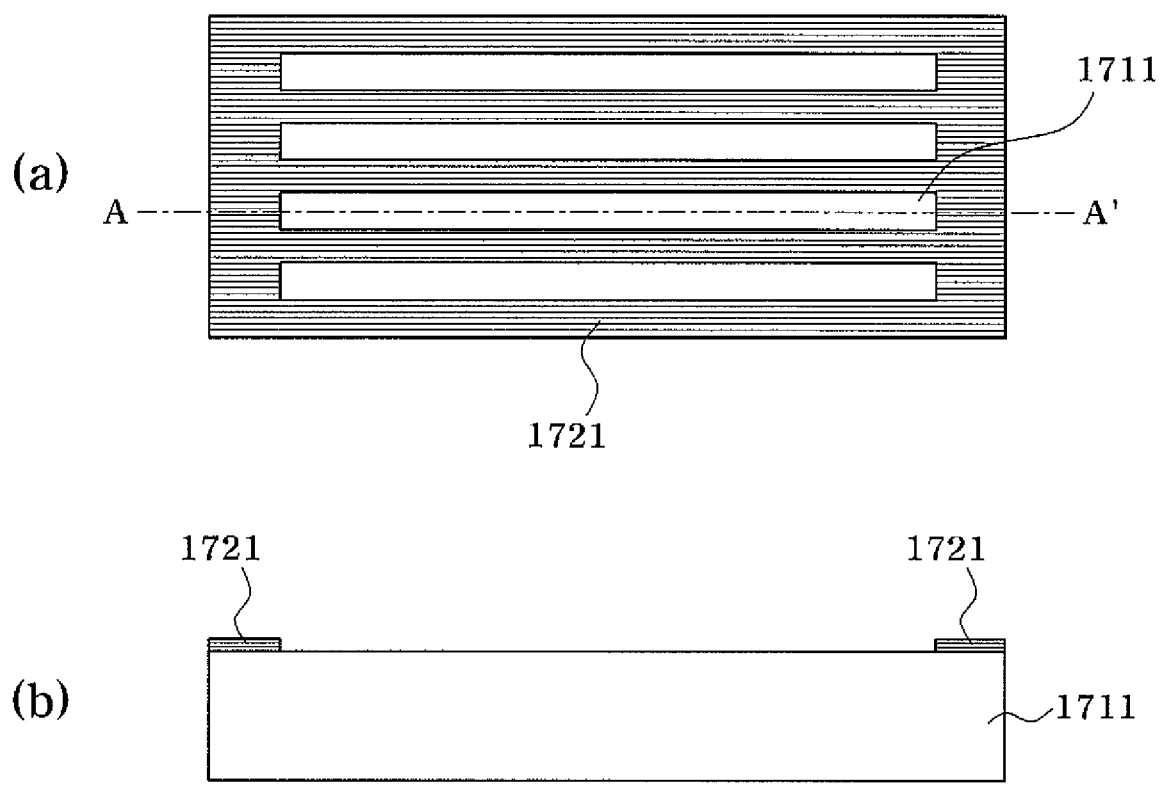

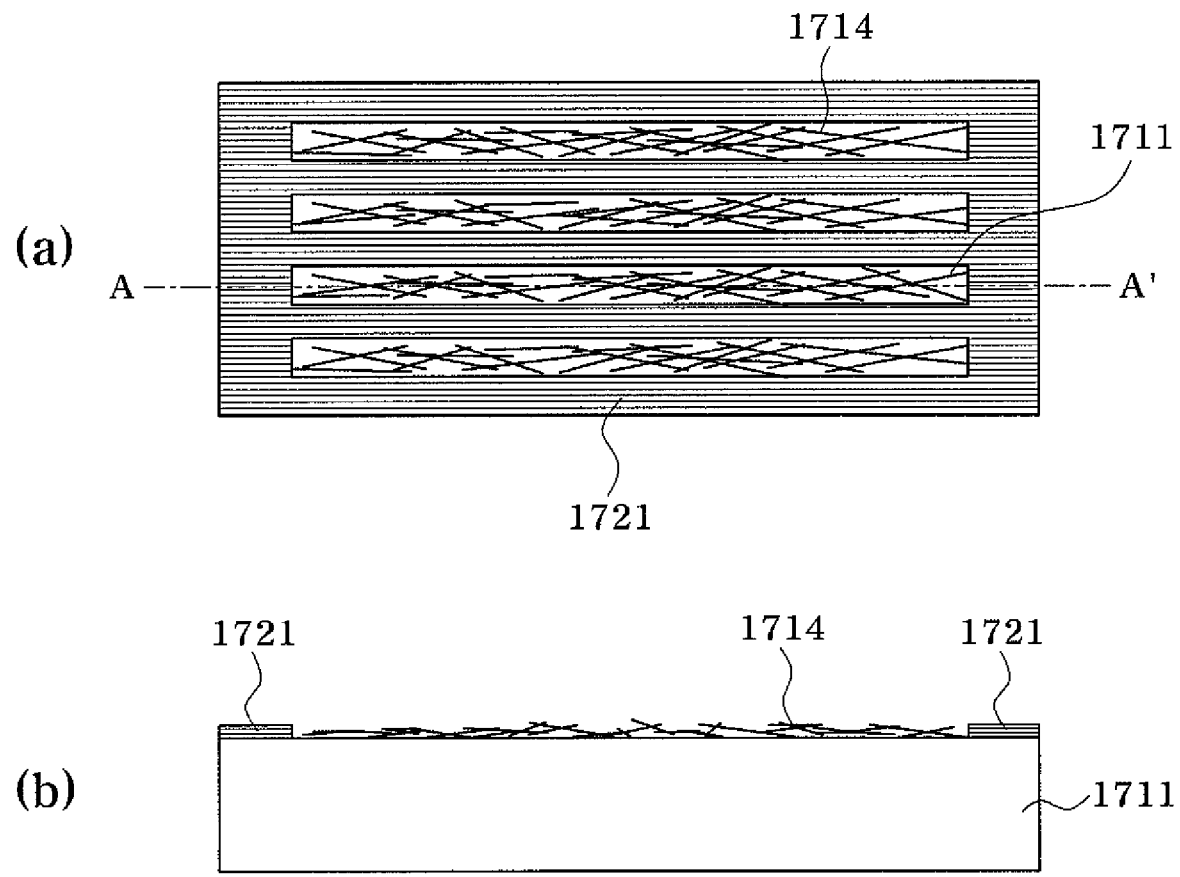
[Fig. 19]

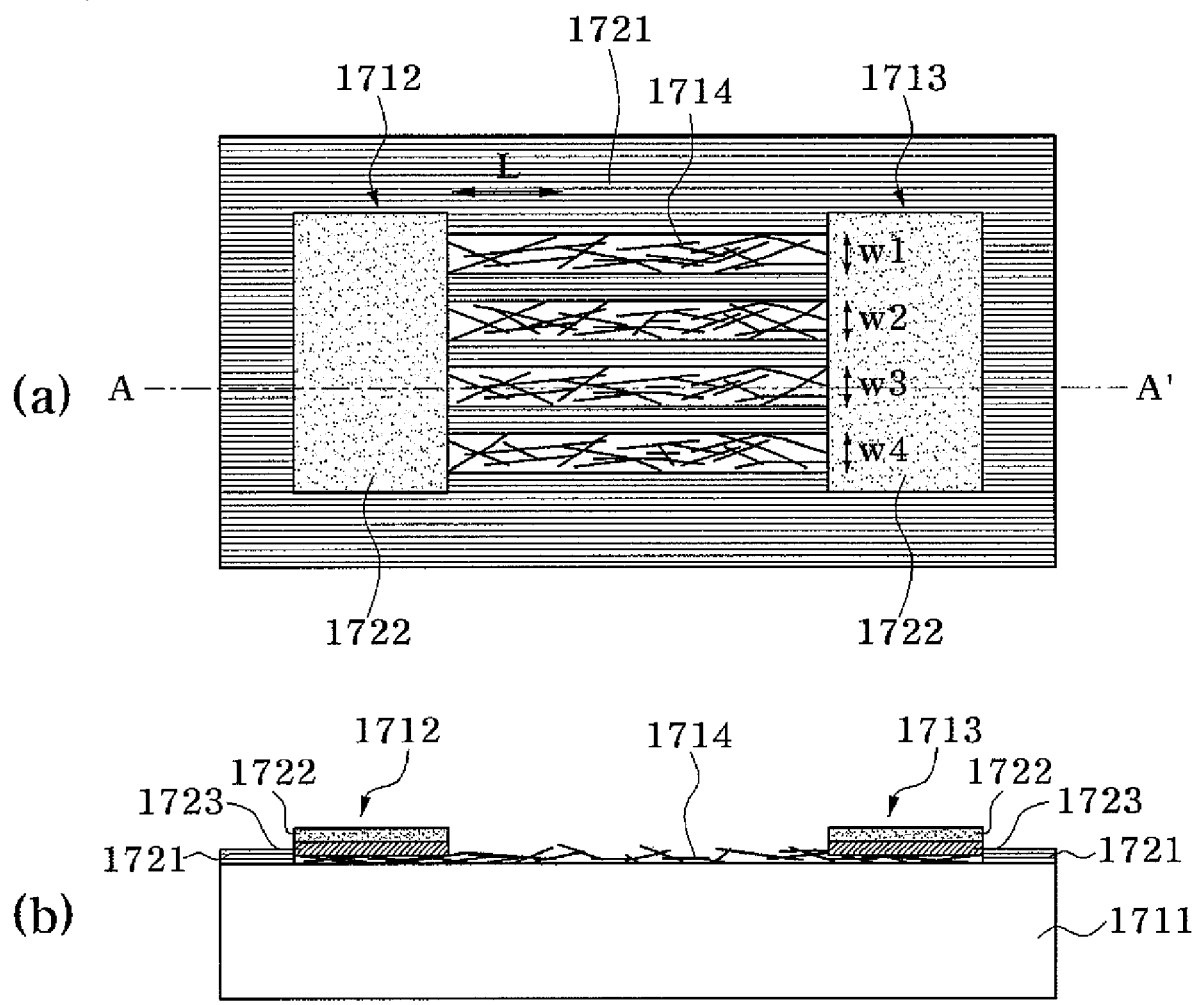
[Fig. 20]

CIRCUIT BOARD INCLUDING ALIGNED NANOSTRUCTURES

BACKGROUND

Recently, there is an increasing amount of interest in new devices based on nanostructures such as carbon nanotubes and nanowires. These devices which employ nanotechnology are being used in a variety of fields such as, for example, electronics, mechanics, optics, and biological engineering. Since metal oxide nanowire (e.g., ZnO, $In_2O_3$, $Fe_2O_3$, etc.) may have better mobility than that of organic conductive material, attention is being focused on metal oxide nanowire as a conductive material in a flexible circuit device.

In the case of a circuit that has a channel formed of nanowires between electrodes, the nanowires having a length shorter than the width of the channel may be randomly distributed in the channel. When the nanowires are randomly distributed without being aligned in the channel, contact resistance of the circuit may be increased and electrical mobility and conductivity of the circuit is possibly reduced.

SUMMARY

In one embodiment, a circuit board includes a substrate, a polar molecular layer pattern and a nonpolar molecular layer pattern, which are disposed on the substrate, a first electrode and a second electrode, which are disposed on the substrate, and one or more channels disposed on the polar molecular layer pattern and including linear nanostructures. The one or more channels may facilitate to electrically couple the first electrode to the second electrode.

In another embodiment a circuit board includes a substrate, a nonpolar molecular layer pattern disposed on the substrate, a first electrode and a second electrode, which are disposed on the substrate, and one or more channels disposed on an exposed region of the substrate that is not covered by the nonpolar molecular layer pattern and including linear nanostructures. The one or more channels may facilitate to electrically couple the first electrode to the second electrode.

In still another embodiment, a method of fabricating a circuit board includes providing a substrate, forming one or more channels having linear nanostructures on the substrate, and forming a first electrode and a second electrode on the substrate and allowing the one or more channels facilitate to electrically couple the first electrode to the second electrode.

The Summary is provided to introduce a selection of concepts in a simplified form that are further described below in the Detailed Description. The Summary is not intended to identify key features or essential features of the claimed subject matter, nor is it intended to be used as an aid in determining the scope of the claimed subject matter.

BRIEF DESCRIPTION OF THE DRAWINGS

FIG. 1 is a perspective view of an illustrative embodiment of a circuit board.

FIG. 2 is a plan view (a) and a cross-sectional view (b) of the circuit board illustrated in FIG. 1.

FIG. 3 is an illustrative embodiment for showing a case (a) in which a single linear pattern is disposed between electrodes on a circuit board and a case (b) in which one or more linear patterns are disposed between electrodes on the circuit board.

FIG. 4 is a perspective view of another illustrative embodiment of a circuit board.

FIG. 5 is a plan view (a) and a cross-sectional view (b) of the circuit board illustrated in FIG. 4.

FIG. 6 is a schematic diagram of still another illustrative embodiment of a circuit board.

FIG. 7 is a plan view (a) and a cross-sectional view (b) of still another illustrative embodiment of a circuit board.

FIG. 8 is a flow chart of an illustrative embodiment of a method for fabricating a circuit board.

FIG. 9 is a flow chart of an illustrative embodiment of a method for forming one or more channels on a substrate.

FIG. 10 is a flow chart of another illustrative embodiment of a method for forming one or more channels on a substrate.

FIGS. 11 to 16 are plan views (a) and cross-sectional views (b) of an illustrative embodiment for fabricating a circuit board.

FIGS. 17 to 20 are plan views (a) and cross-sectional views (b) of another illustrative embodiment for fabricating the circuit board.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes made be made, without departing from the spirit or scope of the subject matter presented here. It will be readily understood that the components of the present disclosure, as generally described herein, and illustrated in the Figures, can be arranged, substituted, combined, and designed in a wide variety of different configurations, all of which are explicitly contemplated and make part of this disclosure. It will also be understood that when an element or layer is referred to as being "on" or "connected to" another element or layer, the element or layer may be directly on or connected to the other element or layer or intervening elements or layers may be present.

FIG. 1 is a perspective view of an illustrative embodiment of a circuit board 100. FIG. 2, for example, provides a plan view (a) and a cross-sectional view (b) of circuit board 100. The example cross-sectional view of (b) is taken along line A-A' in the example plan view (a). Referring to FIGS. 1 and 2, the circuit board 100 includes a substrate 111, a first electrode 112, a second electrode 113, a polar molecular layer pattern 120, a nonpolar molecular layer pattern 121 and channels 130 including linear nanostructures 114. The substrate 111 may be a substrate that includes, but is not limited to, a metal (e.g., gold, aluminum) substrate, a semiconductor (e.g., silicon, silicon-on-insulator) substrate, a glass substrate, or an oxide (e.g., $SiO_2$) substrate.

The polar molecular layer pattern 120 and the nonpolar molecular layer pattern 121 are disposed on the substrate 111. The upper surface of the substrate 111 may be divided into a region of the polar molecular layer pattern 120 and a region of the nonpolar molecular layer pattern 121.

The first electrode 112 and the second electrode 113 are disposed on the substrate 111. The first electrode 112 and the second electrode 113 may be conductors formed of, for example, metal or doped polysilicon. Each of the first electrode 112 and the second electrode 113 may have a single-layer structure or a multilayer structure with a gold layer 122 and a palladium layer 123 as shown in FIG. 2.

In one embodiment, the polar molecular layer pattern 120 may include one or more linear patterns. In one example, the polar molecular layer pattern 120 may include one or more linear patterns alternately disposed with the nonpolar molecular layer pattern 121. The one or more linear patterns may be disposed in parallel with one another between the first electrode 112 and the second electrode 113. A linear pattern, for example, may have a respective width (w). The nonpolar molecular layer pattern 121 may be disposed between linear patterns of polar molecular layer pattern 120. The width (w) of a linear pattern, may be, for example, several nanometers (nm) to several micrometers (gn). A linear pattern having such a width may be fabricated using a microfabrication process such as, for example, photolithography or electron beam lithography. In order for the linear nanostructures 114 to be aligned in a longitudinal direction (L) of a linear pattern, the width (w) of the linear pattern, for example, may be selected depending on the lengths of the linear nanostructures 114. As a ratio of the width of the linear pattern to the average length of the linear nanostructures 114 gets smaller, the probability that the linear nanostructures 114 are aligned in the longitudinal direction (L) of the linear nanostructures 114 may increase. For example, the width (w) of the linear pattern may be less than ½ of the average length of the linear nanostructures 114. In some embodiments, the widths of the linear patterns formed on the circuit board 100 may be equal to or different from one another.

As illustrated in FIGS. 1 and 2, in one embodiment, the linear nanostructures 114 on a linear pattern of the polar molecular layer pattern 120 may form the channel 130 and electrically connect or couple the first electrode 112 to the second electrode 113. The linear nanostructures 114 may adhere to the surface of the polar molecular layer pattern 120 by force such as, for example, electrostatic attractive force. In addition, the linear nanostructures 114 may be substantially confined inside one or more linear patterns of the polar molecular layer pattern 120. Being substantially confined inside the one or more linear patterns, for example, means that even a portion of each body of the linear nanostructures 114 attached to the polar molecular layer pattern 120 does not invade a region of the adjacent nonpolar molecular layer pattern 121, but rather each body of the linear nanostructures 114 is almost wholly positioned inside the one or more linear patterns of the polar molecular layer pattern 120.

In one embodiment, the polar molecular layer pattern 120 may be charged with positive or negative electricity in accordance with the used material thereof. When oxide nanostructures are used as one example of the linear nanostructures 114, the oxide nanostructures may usually have positive or negative surface charges. For example, zinc oxide (ZnO) nanowires may have positive surface charges and vanadium oxide ($V_2O_5$) nanowires may have negative surface charges. When the oxide nanostructures having the positive or negative surface charges are provided onto the polar molecular pattern 120, the oxide nanostructures may adhere to the surface of the polar molecular layer pattern 120 by electrostatic interaction between the oxide nanostructures and the polar molecular layer pattern 120.

In one embodiment, when the substrate 111 is formed of gold, the polar molecular layer pattern 120 may be, for example, a self-assembled monolayer (SAM) having a compound with a carboxyl group end (—COOH/—COO$^-$). In this case, the polar molecular layer pattern 120 may be charged with negative electricity. The compound having the carboxyl group end may be, for example, 16-mercaptohexadecanoic acid (MEA). In another embodiment when the substrate 111 is formed of gold, the polar molecular layer pattern 120 may be, for example, a SAM having a compound with an amino group end (—NH$_2$/—NH$_3^+$) or 2-mercaptoimidazole (2-MI). In this case, the polar molecular layer pattern 120 may be charged with positive electricity. The compound with the amino group end may be, for example, cysteamine. In still another embodiment, when the substrate 111 is formed of silica ($SiO_2$), the polar molecular layer pattern 120 may be, for example, an SAM having aminopropyltriethoxysilane (APTES). In this case, the polar molecular layer pattern 120 may be charged with positive electricity.

The nonpolar molecular layer pattern 121, for example, is not charged with positive or negative electricity but may be neutral. Accordingly, the oxide nanostructure may not be attached to the nonpolar molecular layer pattern 121. Even when the oxide nanostructure is attached to the nonpolar molecular layer pattern 121, the oxide nanostructure may be relatively easily detached from the nonpolar molecular layer pattern 121 compared to the oxide nanostructure attached to the polar molecular layer pattern 120. The nonpolar molecular layer pattern 121 may be, for example, a SAM having a compound with a methyl end. In one embodiment when the substrate 111 is formed of gold, the suitable material for forming the nonpolar molecular layer pattern 121 may be, for example, a thiol compound such as 1-octadecanethiol (ODT). In another embodiment, when the substrate 111 is formed of silica, silicon, or aluminum, the suitable material for forming the nonpolar molecular layer pattern 121 may be, for example, a silane compound such as octadecyltrichlorosilane (OTS), octadecyltrimethoxysilane (OTMS) or octadecyltriethoxysilane (OTE). The polar molecular layer pattern 120 and the nonpolar molecular layer pattern 121 may be formed by, for example, a dip-pen nanolithography (DPN) method, a microcontact printing method (ECP) or a photolithography method.

In one embodiment, the channels 130 may include the linear nanostructures 114. A channel from among the channels 130, for example, may be formed on a linear pattern of the polar molecular layer pattern 120 and may facilitate to electrically couple or connect the first electrode 112 to the second electrode 113. Each of the channels 130 may have at least one of the linear nanostructures 114.

As illustrated, the linear nanostructures 114 are connected to the first electrode 112 and the second electrode 113. Connecting the linear nanostructures 114 to the first electrode 112 and the second electrode 113 is not limited to a case in which each of the linear nanostructures 114 is directly connected to the first electrode 112 and the second electrode 113. To detail this, a portion of one linear nanostructure of the nanostructures 114 may be electrically coupled to the first electrode 112, a portion of another linear nanostructure of the nanostructures 114 may be electrically coupled to the second electrode 113, and the one linear nanostructure and the another linear nanostructure may be electrically coupled to each other. In addition, a portion of one linear nanostructure of the linear nanostructures 114 may be electrically coupled to the first electrode 112, a portion of another linear nanostructure of the linear nanostructures 114 may be electrically coupled to the second electrode 113, and the one linear nanostructure and the another nanostructure may be electrically coupled to each other via yet another linear nanostructure of the linear nanostructures 114.

In one embodiment, the linear nanostructures 114 may include, but is not limited to, a nanotube, a nanowire, or a nanorod. The nanotube, for example, may be a carbon nanotube. The nanowire and nanorod, for example, may be formed of various materials including a conductive polymer, vanadium oxide, indium oxide, zinc oxide, tin oxide, cadmium oxide, silicon, germanium, gallium nitride, or a combination thereof.

In one embodiment, the linear nanostructures 114 may be aligned in a longitudinal direction L of the one or more linear patterns of the polar molecular layer pattern 120. The alignment of the linear nanostructures 114 in the longitudinal direction L does not mean that all of the linear nanostructures 114 are aligned in the longitudinal direction L. The alignment of the linear nanostructures 114 in the longitudinal direction L excludes a case in which the linear nanostructures 114 are arbitrarily disposed. The alignment of the linear nanostructures 114 in the longitudinal direction L may mean that the linear nanostructures 114 are intentionally aligned in the longitudinal direction L. For example, when the number of nanostructures having an angle of 45 degrees or less with respect to the longitudinal direction L is at least two times the number of the nanostructures having an angle exceeding 45 degrees with respect to the longitudinal direction L, it can be determined that the linear nanostructures 114 are aligned in the longitudinal direction L. When the linear nanostructures 114 are aligned in the longitudinal direction L, a resistance between the first electrode 112 and the second electrode 113 may be reduced compared to the case in which the linear nanostructures 114 are arbitrarily disposed. This will be described below with reference to FIG. 3.

In one embodiment the linear nanostructures 114 may be used as a conducting wire for electrically coupling the first electrode 112 to the second electrode 113. For example, the linear nanostructures 114 may be applied to a DNA sensor or a transistor.

The circuit board 100 does not necessarily include a closed circuit formed in the substrate 111. That is, the circuit board 100 may include the first electrode 112, the second electrode 113, which are formed on the substrate 111, and the linear nanostructures 114 which electrically couple the first and second electrodes without the closed circuit.

FIG. 3 is an illustrative embodiment for showing a case (a) in which a single linear pattern is disposed between electrodes 312 and 313 on a circuit board and a case (b) in which one or more linear patterns are disposed between electrodes 312 and 313 on the circuit board. Referring to (a) of FIG. 3, in one embodiment, a polar molecular layer pattern 320 and a nonpolar molecular layer pattern 321 are disposed on a substrate (not shown). When the polar molecular layer pattern 320, for example, is formed of a single linear pattern having a width (W) and is disposed between a first electrode 312 and a second electrode 313, linear nanostructures 314 are randomly distributed on the polar molecular layer pattern 320. When the width (W) is greater than the average length of the linear nanostructures 314, for example, the linear nanostructures 314 may not be aligned. Therefore, an electron as a charge carrier will likely pass through a number of junctions when the electron starts from the first electrode 312 until the electron reaches the second electrode 313. The junctions described above refer to junctions formed between the linear nanostructures 314. As the number of junctions is increased, the mobility and conductivity of electrons in channels formed of the linear nanostructures 314 may be deteriorated.

Meanwhile, referring to (b) of FIG. 3, in one embodiment, the polar molecular layer pattern 120 and the nonpolar molecular layer pattern 121 are disposed on a substrate (not shown). When the polar molecular layer pattern 120 having one or more linear patterns with narrower widths than that of the linear pattern in (a) of FIG. 3 are disposed between the first electrode 112 and the second electrode 113, for example, the linear nanostructures 114 disposed on the linear patterns may be aligned in a longitudinal direction of the linear patterns.

In one embodiment, as illustrated in (a) and (b) of FIG. 3, the linear patterns having widths of w1, w2, w3 and w4 are disposed in parallel with one another between the first electrode 112 and the second electrode 113, and the sum of the widths of the linear patterns is equal to or smaller than the width of the linear pattern illustrated in (a) of FIG. 3 (that is, $w1+w2+w3+w4 \leq W$, w1 to w4 may be equal to or different from one another). In this case, a linear pattern shown in (b) of FIG. 3 may have a relatively narrower width than that of the linear pattern shown in (a) of FIG. 3. Thus, in one embodiment, a narrower linear pattern may cause the linear nanostructures 114 to be more aligned along the narrower linear pattern. Therefore, with a narrow linear pattern, an electron as a charge carrier may pass through a smaller number of (i.e., less) junctions as the electron starts from the first electrode 112 until the electron reaches the second electrode 113. As the number of junctions is decreased, for example, the mobility and conductivity of electrons in channels formed of the linear nanostructures 114 may be improved.

Although it is illustrated in FIGS. 1 to 4 that four channels are formed on a circuit board, more or fewer than four channels may be formed. For example, the number of channels may be determined to maintain the resistance value between the electrodes 112 and 113 in a case of the plurality of channels to be smaller than in a case of a single channel. In this case, the sum of the widths of the plurality of channels may be equal to or less than the width of the single channel.

FIG. 4 is a perspective view of another illustrative embodiment of a circuit board. FIG. 5 is a plan view (a) and a cross-sectional view (b) of the circuit board illustrated in FIG. 4. The cross-sectional view is taken along line A-A' in the plan view. Referring to FIGS. 4 and 5, a circuit board 400 includes a substrate 411, a first electrode 412, a second electrode 413, a nonpolar molecular layer pattern 421, and a channels 430 having linear nanostructures 414.

The substrate 411 may be a metal (e.g., gold, aluminum) substrate, a semiconductor (e.g., silicon, silicon-on-insulator) substrate, a glass substrate, or an oxide (e.g., $SiO_2$) substrate. The nonpolar molecular layer pattern 421 is disposed on the substrate 411. The upper surface of the substrate 411 may be divided into an exposed region of the substrate 411 and a region of the nonpolar molecular layer pattern 421. That is, the exposed region of the substrate 411 indicates the region that is not covered by the nonpolar molecular layer pattern 421.

The first electrode 412 and the second electrode 413 are disposed on the substrate 411. The first electrode 412 and the second electrode 413 may be conductors formed of, for example, metal or doped polysilicon. Each of the first electrode 412 and the second electrode 413 may have a single-layer structure or a multilayer structure with a gold layer 422 and a palladium layer 423 as shown in FIG. 5.

In one example, the exposed region of the substrate 411 may include one or more linear patterns alternately disposed with the nonpolar molecular layer pattern 421. The linear patterns may be disposed in parallel with one another between the first electrode 412 and the second electrode 413. A linear pattern, for example, may have a respective width (w). The nonpolar molecular layer pattern 421, for example, may be disposed between the linear patterns. The width (w) of a linear pattern may be, for example, several nm to several tan. The linear pattern having such a width may be fabricated using a microfabrication process such as, for example, photolithography or electron beam lithography. In order for the linear nanostructures 414 to be aligned in a longitudinal direction (L) of a linear pattern, the width (w) of the linear pattern may be selected depending on the lengths of the linear nanostructures 414. As a ratio of the width of the linear pattern to the average length of the linear nanostructures 414 gets smaller, for example, the probability that the linear nanostructures 414 are aligned in the longitudinal direction (L) of the each linear pattern may increase. For example, the width (w) of the linear pattern may be less than ½ of the average length of the linear nanostructures 414. In some embodiments, the widths of the linear patterns formed on the circuit board 400 may be equal to or different from one another.

As illustrated in FIGS. 4 and 5, in one embodiment, the linear nanostructures 414 on a linear pattern of the exposed region of the substrate 411 form the channel 430 and electrically connect or couple the first electrode 412 to the second electrode 413. The linear nanostructures 414 may adhere to the exposed region of the substrate 411 by force such as, for example, electrostatic attractive force. In addition, the linear nanostructures 414 may be confined inside one or more linear patterns of the exposed region of the substrate 411. Being confined inside the one or more linear patterns, for example, means that even a portion of each body of the linear nanostructures 414 attached to the exposed region of the substrate 411 does not invade a region of the adjacent nonpolar molecular layer pattern 421, but rather each body of the linear nanostructures 414 is almost wholly positioned inside the one or more linear patterns.

In one embodiment, the nonpolar molecular layer pattern 421, the plurality of channels 430, the linear nanostructures 414, and the circuit board 400 are substantially the same as the nonpolar molecular layer pattern 121, the plurality of channels 130, the linear nanostructures 114, and the circuit board 100 described with reference to FIGS. 1 and 2, so that a detailed description thereof is omitted for simplicity. As described above, the linear nanostructures 414 are attached to the exposed region of the substrate 411. The surface of the substrate 411 is originally polarized, so that the surface of the substrate 411 can act similarly to the polar molecular layer pattern 120. That is, the linear nanostructures 414 may not be attached to the nonpolar molecular layer pattern 421 but be attached to the exposed region of the substrate 411, so that the linear nanostructures 414 can be aligned in the longitudinal direction of the each linear pattern of the exposed region.

A resistance value between the electrodes 412 and 413 may be lowered by narrowing the width of a linear pattern. As illustrated in FIGS. 4 and 5, for example, a plurality of linear patterns having relatively narrow widths may improve the alignment of the linear nanostructures 414. Even though the sum of the widths of the linear patterns is equal to the width of a single linear pattern, the resistance value between the electrodes 412 and 413 may be lowered. For example, a number of the channels 430 may be determined to maintain the resistance value between the electrodes 412 and 413 in a case of a plurality of channels 430 to be smaller than in a case of a single channel. In this case, the sum of the widths of the channels 430 may be equal to or less than the width of the single channel.

FIG. 6 is a schematic diagram of still another illustrative embodiment of a circuit board 600. Like the circuit boards 100 and 400 described with reference to FIGS. 1 and 4, a circuit board 600 includes electrodes 612 and 613 and a channels 630 including linear nanostructures 614. The channels 630 may be disposed on one or more linear patterns of a polar molecular layer pattern 620 or one or more linear patterns of an exposed region of the substrate 611 that are not covered by a nonpolar molecular layer pattern 621.

In one embodiment, the circuit board 600 may further include at least one additional linear pattern connecting adjacent linear patterns to each other. Referring to FIG. 6, in this example, the circuit board 600 may further include at least one additional channel 635 connecting the adjacent channels to each other in addition to the plurality of channels 630. The at least one additional channel 635 may include linear nanostructures 614. The at least one additional channel 635 may cross two or more adjacent channels of the plurality of channels 630, so that at least one additional channel 635 may be connected to the two or more adjacent channels. An angle between each of the plurality of channels 630 and the at least one additional channel 635 may be, for example, 90 degrees or less.

In one embodiment the channels 630 connecting the electrodes 612 and 613 may include networks of the linear nanostructures 614. When some channels of the plurality of channels 630 break in the process of fabricating or operating the circuit board 600, these defects may cause the resistance between the electrodes 612 and 613 to increase. However, as illustrated in FIG. 6, when there is the at least one additional channel 635, an electric current may bypass to another adjacent channel electrically connected to the at least one additional channel 635 in spite of these defects.

FIG. 7 is a plan view (a) and a cross-sectional view (b) of still another illustrative embodiment of a circuit board. The cross-sectional view is taken along line A-A' in the plan view. Like the circuit boards 100 and 400 described with reference to FIGS. 1 and 4, a circuit board 700 includes electrodes 712 and 713 and a plurality of channels 730 including linear nanostructures 714. As illustrated in FIG. 7, the plurality of channels 730 may be disposed on a polar molecular layer pattern 720 or on an exposed region (not shown) of a substrate 710 that is not covered by a nonpolar molecular layer pattern 721. An additional polar molecular layer pattern 720' and an additional nonpolar molecular layer pattern 721' are disposed on the plurality of channels 730. In addition, a plurality of additional channels 730' electrically connecting the first electrode 712 to the second electrode 713 may be disposed on the additional polar molecular layer pattern 720'. The plurality of additional channels 730' are electrically isolated from the plurality of channels 730 by the additional polar molecular layer pattern 720' and the additional nonpolar molecular layer pattern 721' disposed therebetween. To be more reliably electrically isolated, an insulating layer (not shown) may be interposed between a layer of the plurality of channels 730 and a layer of the additional polar molecular layer pattern 720' and the additional nonpolar molecular layer pattern 721'. The plurality of additional channels 730' include additional nanostructures 714'

In some embodiments, a plurality of additional channels may have a multilayer structure including two or more stacked layers using the above-described method. The circuit board 700 of FIG. 7 has the linear nanostructures 714' aligned in each of the plurality of additional channels 730', which enhancing mobility and conductivity of the circuit board 700. In addition, the plurality of additional channels 730' are three-dimensionally formed, so that limited space resulting from two-dimensionally formed channels between the first electrode 712 and the second electrode 713 can be overcome.

FIG. 8 is a flow chart of an illustrative embodiment of a method for fabricating a circuit board. Beginning in block 810, in one embodiment, a substrate for fabricating a circuit board is provided. For example, the substrate may be a metal (e.g., gold, aluminum) substrate, a semiconductor (e.g., silicon, silicon-on-insulator) substrate, a glass substrate, or an oxide (e.g., $SiO_2$) substrate.

In block 820, in one embodiment, a plurality of channels having linear nanostructures is formed on the substrate. In this case, an assembly of the linear nanostructures may form a channel, and the channel may be plurally formed on the substrate. The linear nanostructures may include, for example, a nanotube, a nanowire, or a nanorod. The nanotube may be a carbon nanotube. The nanowire and nanorod may be formed of various materials including a conductive polymer, vanadium oxide, indium oxide, zinc oxide, tin oxide, cadmium oxide, silicon, germanium, gallium nitride, or a combination thereof. The circuit board does not necessarily include a closed circuit when forming a circuit on the substrate, and may have the first electrode, the second electrode and the linear nanostructures on the substrate without the closed circuit.

In block 830, in one embodiment, a first electrode and a second electrode are formed on the substrate to allow the channels to electrically connect the first electrode to the second electrode. The first electrode and the second electrode may be conductors, and may contact channels having linear nanostructures. As a result, the circuit board is fabricated.

FIG. 9 is a flow chart of an illustrative embodiment of a method for forming a plurality of channels on a substrate. In block 821, a polar molecular layer pattern and a nonpolar molecular layer pattern are formed on a substrate. The polar molecular layer pattern may be formed to have a plurality of linear patterns. The polar molecular layer pattern may be charged with positive or negative electricity, and thus can attract the linear nanostructures having positive or negative charges. Whereas, the nonpolar molecular layer pattern is not charged with positive or negative electricity but rather may be neutral.

In block 822, in one embodiment the linear nanostructures are self-assembled in the polar molecular layer pattern to form a plurality of channels. The linear nanostructures may be self-assembled in one or more linear patterns of the polar molecular layer pattern to form a plurality of channels. The surfaces of the linear nanostructures may be charged with positive or negative electricity, and thus the linear nanostructures may be self-assembled in the polar molecular layer by electrostatic interaction. Since the linear nanostructures are formed along a linear pattern from among the one or more linear patterns of the polar molecular layer, the plurality of channels having the linear nanostructures can be formed.

FIG. 10 is a flow chart of another illustrative embodiment of a method for forming a plurality of channels on a substrate. In block 823, in one embodiment, a nonpolar molecular layer pattern is formed on a substrate. An exposed region of the substrate, which is a region that is not covered by the nonpolar molecular layer pattern, may be charged with positive or negative electricity like the polar molecular layer pattern described in FIG. 9 and thus can attract the linear nanostructures having positive or negative charges. Whereas, the nonpolar molecular layer pattern is not charged with positive or negative electricity but rather may be neutral.

In block 824, in one embodiment, the linear nanostructures are self-assembled in the exposed region of the substrate that is not covered by the nonpolar molecular layer pattern, so that a plurality of channels is formed. The surfaces of the linear nanostructures are charged with positive or negative electricity, and thus the linear nanostructures may be self-assembled in the exposed region of the substrate surface by electrostatic interaction. Since the linear nanostructures are formed along one or more linear patterns of the exposed substrate surface, the plurality of channels having the linear nanostructures can be formed.

In still another embodiment, when the channels are formed by the self-assembling of the linear nanostructures in blocks 822 and 824, at least one additional channel connecting the channels adjacent to each other may be further formed on the substrate. The at least one additional channel is described with reference to FIG. 6.

FIGS. 11 to 16 are plan views (a) and cross-sectional views (b) of an illustrative embodiment for fabricating a circuit board. The cross-sectional view (b) of each drawing is taken along line A-A' in the plan view. Referring to FIG. 11, in one embodiment, a substrate 1111 is provided. Various kinds of substrates may be used as the substrate 1111 such as a metal (e.g., gold, aluminum) substrate, a semiconductor (e.g., silicon, silicon on insulator) substrate, a glass substrate or an oxide (e.g., $SiO_2$) substrate.

Referring to FIG. 12, in one embodiment a polar molecular layer pattern 1120 and a nonpolar molecular layer pattern 1121 are formed on the substrate 1111. After the formation of the polar molecular layer pattern 1120 and the nonpolar molecular layer pattern 1121, the upper surface of the substrate 1111 may be divided into a region of the polar molecular layer pattern 1120 and a region of the nonpolar molecular layer pattern 1121. The polar molecular layer pattern 1120 may include a plurality of linear patterns alternately disposed with the nonpolar molecular layer pattern 1121. The plurality of linear patterns may be disposed in parallel with one another between the first electrode 1112 and the second electrode 1113.

In one embodiment, the polar molecular layer pattern 1120 may be charged with positive or negative electricity in accordance with the used material thereof. When an oxide nanostructure as one example of the nanostructures usually having surface charges is provided onto the polar molecular pattern 1120, the oxide nanostructure adheres to the surface of the polar molecular layer pattern 1120 by electrostatic interaction between the oxide nanostructure and the polar molecular layer pattern 1120. In one embodiment, when the substrate 1111 is formed of gold, the polar molecular layer pattern 1120 may be, for example, a self-assembled monolayer (SAM) having a compound with a carboxyl group end (—COOH/—COO⁻). In this case, the polar molecular layer pattern 1120 may be charged with negative electricity. The compound having the carboxyl group end may be, for example, 16-mercaptohexadecanoic acid (MHA). In another embodiment, when the substrate 1111 is formed of gold, the polar molecular layer pattern 1120 may be, for example, a SAM having a compound with an amino group end (—$NH_2$/—$NH_3^+$) or a SAM having 2-mercaptoimidazole (2-MI). In this case, the polar molecular layer pattern 1120 may be charged with positive electricity. The compound with the amino group end may be, for example, cysteamine. In still another embodiment, when the substrate 1111 is formed of silica ($SiO_2$), the polar molecular layer pattern 1120 may be, for example, an SAM having aminopropyltriethoxysilane (APTES). In this case, the polar molecular layer pattern 120 may be charged with positive electricity.

In one embodiment the nonpolar molecular layer pattern 1121 may not be charged with positive or negative electricity but rather may be neutral. Accordingly, the oxide nanostructure may not be attached to the nonpolar molecular layer pattern 1121. Even when the oxide nanostructure is attached to the nonpolar molecular layer pattern 1121, it may be relatively easily detached from the nonpolar molecular layer pattern 1121 compared to the oxide nanostructure attached to the polar molecular layer pattern 1120. The nonpolar molecular layer pattern 1121 may be, for example, an SAM having a compound with a methyl end. In one embodiment, when the substrate 1111 is formed of gold, the suitable material for forming the nonpolar molecular layer pattern 1121 may be a thiol compound such as 1-octadecanethiol (ODT). In another embodiment, when the substrate 1111 is formed of silica, silicon, or aluminum, the suitable material for forming the nonpolar molecular layer pattern 1121 may be, for example, a silane compound such as octadecyltrichlorosilane (OTS), octadecyltrimethoxysilane (OTMS) or octadecyltriethoxysilane (OTE). The polar molecular layer pattern 1120 and the nonpolar molecular layer pattern 1121 may be formed by, for example, a dip-pen nanolithography (DPN) method, a microcontact printing method (μCP) or a photolithography method.

Referring to FIG. 13, in one embodiment linear nanostructures 1114 are self-assembled in the polar molecular layer pattern 1120. In one embodiment, as illustrated in FIG. 14, the linear nanostructures 1114 may be self-assembled in the polar molecular layer pattern 1120 by immersing the substrate 1111 in a solution 1130 including the linear nanostructures 1114. In another embodiment, as illustrated in FIG. 15, the linear nanostructures 1114 may be self-assembled in the polar molecular layer pattern 1120 by immersing the substrate 1111 in the solution 1130 including the linear nanostructures 1114 and applying a bias voltage between the solution 1130 and the substrate 1111. In one example, when the bias voltage is applied between the solution 1130 and the substrate 111 the linear nanostructures 1114 may be self-assembled in the polar molecular layer pattern 1120 at an improved speed. For example, when a negative (−) bias is applied to the substrate 1111 where the polar molecular layer pattern 1120 charged with negative electricity is formed, at least one nanostructure of the linear nanostructures 1114 charged with positive electricity may be self-assembled in the polar molecular layer pattern 1120 at a higher speed. Whereas, when a positive (+) bias is applied to the substrate 1111 where the polar molecular layer pattern 1120 charged with positive electricity is formed, at least one nanostructure of the linear nanostructures 1114 charged with negative electricity may be self-assembled in the polar molecular layer pattern 1120 at a higher speed.

The solution 1130 including the linear nanostructures 1114, for example, carbon nanotubes, may be formed by putting the carbon nanotubes into 1,2-dichlorobenzene and applying ultrasonic waves thereto. In addition, a solution including nanowires may be formed by putting the nanowires into deionized water or an organic solvent and applying ultrasonic waves thereto.

Even though the linear nanostructures 1114 are not oxides themselves, their surfaces may be oxidized in the air and then charged with positive or negative electricity. Accordingly, when the substrate 1111 is immersed in the solution 1130 including the charged linear nanostructures 1114 as described above, the linear nanostructures 1114 may be adsorbed onto the polar molecular layer pattern 1120 caused by electrostatic interaction between the polar molecular layer pattern 1120 and the linear nanostructures 1114.

The electrostatic interaction between the linear nanostructures 1114 and the polar molecular layer pattern 1120 may be a charge-charge interaction or a van der Waals force such as a dipole-driven force. In one embodiment, zinc oxide (ZnO) exhibits a positive charge due to the presence of an oxygen vacancy, so that the nanostructures formed of the zinc oxide may be strongly adsorbed onto the surface of the polar molecular layer pattern 1120 charged with negative electricity. In another embodiment, vanadium oxide ($V_2O_5$) exhibits a negative charge, so that it may be adsorbed onto the surface of the polar molecular layer pattern 1120 charged with positive electricity. In still another embodiment, the carbon nanotube may be adsorbed onto not only the surface of the polar molecular layer pattern 1120 charged with positive electricity but also the surface of the polar molecular layer pattern 1120 charged with negative electricity.

Referring to FIG. 16, in one embodiment, a first electrode 1112 and a second electrode 1113 are formed on the polar molecular layer pattern 1120. The first electrode 1112 and the second electrode 1113 may be conductors, and may be, for example, a metal such as aluminum (Al), palladium (Pd), titanium (Ti), or gold (Au), or doped polysilicon. Each of the first electrode 1112 and the second electrode 1113 may have a single-layer structure or a multilayer structure (e.g., Au/Pd or Au/Ti). As illustrated in FIG. 16, for example, each of the first electrode 1112 and the second electrode 1113 may have a multilayer structure having a gold (Au) layer 1122 and a palladium (Pd) layer 1123. Patterning of the first electrode 1112 and the second electrode 1113 may be carried out by, for example, a photolithography process and a lift-off process. Referring to FIGS. 12 to 16, in one embodiment, the linear nanostructures 1114 is attached to the polar molecular layer pattern 1120 before the first electrode 1112 and the second electrode 1113 are formed. Alternatively, the linear nanostructures 1114 may be attached to the polar molecular layer pattern 1120 after the first electrode 1112 and the second electrode 1113 are formed. When the linear nanostructures 1114 are self-assembled in the polar molecular layer pattern 1120, the linear nanostructures 1114 may be aligned in a longitudinal direction (L) of the linear patterns of the polar molecular layer pattern 1120. As the widths w1 to w4 of the linear patterns are narrower, for example, an extent to which the linear nanostructures 1114 are aligned in the longitudinal direction (L) may be increased. For example, the width of each linear pattern may be less than ½ of the average length of the linear nanostructures 1114.

FIGS. 17 to 20 are plan views (a) and cross-sectional views (b) of another illustrative embodiment for fabricating the circuit board. The cross-sectional view (b) of each drawing is taken along line A-A' in the plan view.

Referring to FIG. 17, in one embodiment, a substrate 1711 is provided. Various kinds of substrates such as a metal (e.g., gold, aluminum) substrate, a semiconductor (e.g., silicon, silicon on insulator) substrate, a glass substrate or an oxide (e.g., $SiO_2$) substrate may be used as the substrate 1711.

Referring to FIG. 18, in one embodiment, a nonpolar molecular layer pattern 1721 is formed on the substrate 1711. Various kinds of materials applied to the nonpolar molecular layer pattern 1121 described with reference to FIG. 12 may be used for the nonpolar molecular layer pattern 1721. In forming the nonpolar molecular layer pattern 1721 on the substrate 1711, the nonpolar molecular layer pattern 1721 is formed to expose a portion of the upper surface of the substrate 1711, as illustrated in the drawing. The exposed region of the substrate 1711 that is not covered by the nonpolar molecular layer pattern 1721 may include a plurality of linear patterns alternately disposed with the nonpolar molecular layer pattern 1721. The linear patterns may be disposed in parallel with one another between the first electrode 1712 and the second electrode 1713.

Referring to FIG. 19, in one embodiment, linear nanostructures 1714 are self-assembled in the exposed region of the substrate 1711. In one embodiment, the linear nanostructures 1714 may be self-assembled in the exposed region by immersing the substrate 1711 into a solution 1730 including the linear nanostructures 1714. In another embodiment, the linear nanostructures 1714 may be self-assembled in the exposed region by immersing the substrate 1711 into a solution 1730 including the linear nanostructures 1714 and applying a bias voltage between the solution 1730 and the substrate 1711. Since such an immersion is similar to those shown in FIGS. 14 and 15, a detailed description thereof will be omitted.

Referring to FIG. 20, in one embodiment, a first electrode 1712 and a second electrode 1713 are formed on the substrate 1711. Various kinds of materials applied to the first electrode 1112 and the second electrode 1113 described with reference to FIG. 16 may be used for the first electrode 1712 and the second electrode 1713. In the drawing, each of the first electrode 1712 and the second electrode 1713 has a multilayer structure having a gold (Au) layer 1722 and a palladium (Pd) layer 1723.

Referring to FIGS. 18 to 20, in one embodiment, the linear nanostructures 1714 are attached to the exposed region of the substrate 1711 before the first electrode 1712 and the second electrode 1713 are formed. Alternatively, the linear nanostructures 1714 may be attached to the exposed region of the substrate 1711 after the first electrode 1712 and the second electrode 1713 are formed. When the linear nanostructures 1714 are self-assembled in the exposed region, the linear nanostructures 1714 may be aligned in a longitudinal direction (L) of the linear patterns of the exposed region. As the widths w1 to w4 of the linear patterns are narrower, for example, an extent to which the linear nanostructures 1714 are aligned in the longitudinal direction (L) may be increased. For example, the width of each linear pattern may be less than ½ of the average length of the linear nanostructures 1714.

In one embodiment, the linear nanostructures 1714 are attached to a region of the substrate 1711 where the nonpolar molecular layer pattern 1721 is not formed. The surface of the substrate 1711 is naturally polarized, so that it can act similarly to the polar molecular layer pattern 1720. That is, the linear nanostructures 1714 may not be attached to the nonpolar molecular layer pattern 1720 but to the exposed region of the substrate 1711 and aligned in the longitudinal direction of the linear patterns of the exposed region.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A circuit board comprising:
a substrate;
a polar molecular layer pattern and a nonpolar molecular layer pattern, which are disposed on the substrate;
a first electrode and a second electrode, which are disposed on the substrate; and
one or more channels disposed on the polar molecular layer pattern, the one or more channels including linear nanostructures,
wherein the one or more channels facilitate electrical coupling of the first electrode to the second electrode,
wherein the one or more channels are each disposed between two or more linear portions of the nonpolar molecular layer pattern,
and wherein a width of at least one of the channels is less than half of the average length of the linear nanostructures.

2. The circuit board of claim 1, wherein the polar molecular layer pattern is a monolayer pattern having a compound with an amino group end or a carboxyl group end.

3. The circuit board of claim 1, wherein the nonpolar molecular layer pattern is a monolayer pattern having a compound with a methyl end.

4. The circuit board of claim 1, wherein the linear nanostructures comprise one or more of a nanotube, a nanowire, or a nanorod.

5. The circuit board of claim 1, wherein the linear nanostructures are substantially completely positioned inside the polar molecular layer pattern.

6. The circuit board of claim 1, wherein the linear nanostructures are aligned in a longitudinal direction of the one or more channels.

7. The circuit board of claim 1, comprising:
at least two of the channels disposed on the polar molecular layer, each channel extending in a direction between the first electrode and the second electrode, wherein at least a portion of the nonpolar molecular layer pattern is disposed between each channel; and
at least one additional channel disposed on the polar molecular layer pattern for coupling the at least two channels extending in a direction between the first electrode and the second electrode.

8. The circuit board of claim 1, further comprising:
an additional polar molecular layer pattern and an additional nonpolar molecular layer pattern, which are disposed on the one or more channels; and
one or more additional channels disposed on the additional polar molecular layer pattern and electrically coupling the first electrode to the second electrode.

9. A circuit board comprising:
a substrate;
a polar molecular layer pattern and a nonpolar molecular layer pattern, which are disposed on the substrate;
a first electrode and a second electrode, which are disposed on the substrate; and
one or more channels disposed on the polar molecular layer pattern, the one or more channels including linear nanostructures,
wherein the one or more channels facilitate electrical coupling of the first electrode to the second electrode, and
wherein the circuit board is configured so that a number of the one or more channels correlates with a resistance value between the first electrode and the second electrode.

10. The circuit board of claim 9, further comprising:
an additional polar molecular layer pattern and an additional nonpolar molecular layer pattern, which are disposed on the one or more channels; and
one or more additional channels disposed on the additional polar molecular layer pattern and electrically coupling the first electrode to the second electrode.

11. The circuit board of claim 9, wherein the linear nanostructures comprise one or more of a nanotube, a nanowire, or a nanorod.

12. The circuit board of claim 9, comprising at least two channels disposed on the polar molecular layer pattern, the at least two channels including linear nanostructures, wherein at least a portion of the nonpolar molecular layer pattern is disposed between each channel.

13. A circuit board comprising:
a substrate;
a nonpolar molecular layer pattern disposed on the substrate;
a first electrode and a second electrode, which are disposed on the substrate; and
one or more channels disposed on an exposed region of the substrate that is not covered by the nonpolar molecular layer pattern, the one or more channels including linear nanostructures,
wherein the one or more channels facilitate electrical coupling of the first electrode to the second electrode, and wherein the circuit board is configured so that a number of the one or more channels correlates with a resistance value between the first electrode and the second electrode.

14. The circuit board of claim 13, wherein the linear nanostructures comprise one or more of a nanotube, a nanowire, or a nanorod.

15. The circuit board of claim 13, wherein the nonpolar molecular layer pattern is a monolayer pattern having a compound with a methyl end.

16. The circuit board of claim 13, further comprising:
an additional nonpolar molecular layer pattern, which is disposed on the one or more channels; and
one or more additional channels disposed on an exposed region of the substrate that is not covered by the additional nonpolar molecular layer pattern, wherein the one or more additional channels electrically couple the first electrode and the second electrode.

17. The circuit board of claim 13, wherein the nonpolar molecular layer pattern is a monolayer pattern having a compound selected from the group consisting of 1-octadecanethiol (ODT), octadecyltrichlorosilane (OTS), octadecyltrimethoxysilane (OTMS), and octadecyltriethoxysilane (OTE).

18. A circuit board comprising
a substrate;
a nonpolar molecular layer pattern disposed on the substrate;
a first electrode and a second electrode, which are disposed on the substrate; and
one or more channels disposed on an exposed region of the substrate that is not covered by the nonpolar molecular layer pattern, the one or more channels including linear nanostructures,
wherein the one or more channels facilitate electrical coupling of the first electrode to the second electrode,
wherein the one or more channels are each disposed between two or more linear portions of the nonpolar molecular layer pattern, and
wherein a width of at least one of the channels is less than half of the average length of the linear nanostructures.

19. The circuit board of claim 18, wherein the linear nanostructures are substantially completely positioned inside the exposed region of the substrate that is not covered by the nonpolar molecular layer pattern.

20. The circuit board of claim 18, wherein the linear nanostructures are aligned in a longitudinal direction of the one or more channels.

21. The circuit board of claim 18, comprising:
at least two of the channels disposed on the exposed region of the substrate that is not covered by the nonpolar molecular layer pattern, each channel extending in a direction between the first electrode and the second electrode, wherein at least a portion of the nonpolar molecular layer pattern is disposed between each channel; and
at least one additional channel disposed on the exposed region of the substrate that is not covered by the nonpolar molecular layer pattern for coupling the at least two channels extending in a direction between the first electrode and the second electrode.

22. A circuit board comprising:
a substrate;
a polar molecular layer pattern and a nonpolar molecular layer pattern, which are disposed on the substrate;
a first electrode and a second electrode, which are disposed on the substrate; and
at least two channel disposed on the polar molecular layer pattern, the at least two channels including linear nanostructures,
wherein the one or more channels facilitate electrical coupling of the first electrode to the second electrode,
wherein at least a portion of the nonpolar molecular layer pattern is disposed between each channel, and wherein a number of linear nanostructures that form an angle of 45° or less with respect to a longitudinal direction of the at least two channels is at least about twice a number of the linear nanostructure that form an angle greater than 45° with respect to the longitudinal direction of the at least two channels.

23. The circuit board of claim 22, wherein the at least two of the channels disposed on the polar molecular layer have about the same width.

24. The circuit board of claim 22, wherein the at least two of the channels disposed on the polar molecular layer are generally parallel.

25. The circuit board of claim 22, wherein the polar molecular layer pattern is a monolayer pattern having a compound selected from the group consisting of 16-mercaptohexadecanoic acid (MHA), 2-mercaptoimidazole (2-MI), cysteamine, and aminopropyltriethoxysilane (APTES).

26. The circuit board of claim 22, wherein the nonpolar molecular layer pattern is a monolayer pattern having a compound selected from the group consisting of 1-octadecanethiol (ODT), octadecyltrichlorosilane (OTS), octadecyltrimethoxysilane (OTMS), and octadecyltriethoxysilane (OTE).

27. The circuit board of claim 22, wherein the linear nanostructures comprise carbon nanotubes.

28. The circuit board of claim 22, wherein the linear nanostructures comprise a conductive polymer, vanadium oxide, indium oxide, zinc oxide, tin oxide, cadmium oxide, silicon, germanium, gallium nitride.

* * * * *

UNITED STATES PATENT AND TRADEMARK OFFICE
CERTIFICATE OF CORRECTION

PATENT NO.        : 8,178,787 B2
APPLICATION NO.   : 12/198744
DATED             : May 15, 2012
INVENTOR(S)       : Hong et al.

It is certified that error appears in the above-identified patent and that said Letters Patent is hereby corrected as shown below:

Title Page:
On Page 2, in Field (56), under "OTHER PUBLICATIONS", in Column 2,
Line 7, delete "Devices, """ and insert - - Devices," - -, therefor.

In the Specification:
In Column 1, Line 34, delete "embodiment" and insert - - embodiment, - -, therefor.

In Column 3, Line 9, delete "(gn)." and insert - - ($\mu$m). - -, therefor.

In Column 3, Line 63, delete "(MEA). In another embodiment" and
insert - - (MHA). In another embodiment, - -, therefor.

In Column 4, Line 19, delete "embodiment" and insert - - embodiment, - -, therefor.

In Column 4, Line 31, delete "(ECP)" and insert - - ($\mu$CP) - -, therefor.

In Column 5, Line 24, delete "embodiment" and insert - - embodiment, - -, therefor.

In Column 6, Line 59, delete "tan." and insert - - $\mu$m. - -, therefor.

In Column 8, Line 10, delete "embodiment" and insert - - embodiment, - -, therefor.

In Column 8, Line 45, delete "714'" and insert - - 714'. - -, therefor.

In Column 9, Line 28, delete "embodiment" and insert - - embodiment, - -, therefor.

In Column 10, Line 10, delete "embodiment" and insert - - embodiment, - -, therefor.

In Column 10, Line 49, delete "120" and insert - - 1120 - -, therefor.

Signed and Sealed this
Seventeenth Day of September, 2013

Teresa Stanek Rea
*Deputy Director of the United States Patent and Trademark Office*

CERTIFICATE OF CORRECTION (continued)
U.S. Pat. No. 8,178,787 B2

In Column 10, Line 51, delete "embodiment" and insert -- embodiment, --, therefor.

In Column 11, Line 7, delete "embodiment" and insert -- embodiment, --, therefor.

In Column 11, Line 19, delete "111" and insert -- 1111, --, therefor.

In the Claims:

In Column 14, Lines 4-5, in Claim 6, delete "nano structures" and insert -- nanostructures --, therefor.

In Column 14, Line 7, in Claim 7, delete "comprising:" and insert -- further comprising: --, therefor.

In Column 14, Line 51, in Claim 12, delete "comprising" and insert -- further comprising --, therefor.

In Column 15, Line 25, in Claim 18, delete "comprising" and insert -- comprising: --, therefor.